United States Patent [19]

Higuchi

[11] Patent Number: 4,882,836
[45] Date of Patent: Nov. 28, 1989

[54] PRECISION AUTOMATIC ASSEMBLY APPARATUS INCLUDING AIR CORE COILS AND CORRESPONDING MAGNETIC POLES

[75] Inventor: Toshiro Higuchi, Yokohama, Japan

[73] Assignee: Research Development Corporation, Tokyo, Japan

[21] Appl. No.: 184,744

[22] Filed: Apr. 22, 1988

Related U.S. Application Data

[62] Division of Ser. No. 37,919, Apr. 13, 1987.

[30] Foreign Application Priority Data

Feb. 20, 1987 [JP] Japan .................................. 62-35901
Feb. 20, 1987 [JP] Japan .................................. 62-35902

[51] Int. Cl.[4] ............................................. B25J 11/00
[52] U.S. Cl. ...................................... 29/719; 901/29; 414/730
[58] Field of Search ......................... 33/644; 324/208; 29/468, 719

[56] References Cited

U.S. PATENT DOCUMENTS

| | | | |
|---|---|---|---|
| 3,893,217 | 7/1975 | Edmond | 29/407 |
| 4,316,329 | 2/1982 | Watson | 33/169 C |
| 4,409,736 | 10/1983 | Seltzer | 33/169 C |
| 4,440,031 | 4/1984 | De Fazio | 73/862.04 |
| 4,517,744 | 5/1985 | Consales et al. | 33/169 C |
| 4,603,284 | 7/1986 | Perzley | 318/568 |
| 4,621,332 | 11/1986 | Sugimoto et al. | 364/513 |
| 4,631,959 | 12/1986 | Motycka | 73/189 |
| 4,694,230 | 9/1987 | Slocum et al. | 318/568 |
| 4,738,015 | 4/1988 | Kato | 29/407 |

Primary Examiner—Robert J. Spar
Assistant Examiner—William M. Hienz
Attorney, Agent, or Firm—Armstrong, Nikaido, Marmelstein, Kubovcik & Murray

[57] ABSTRACT

A precision automatic assembly apparatus for inserting an insertable part into a hole formed in a member includes a movable hand incorporating a movable body to which the insertable part is attached, and an electromagnetic wrist mechanism having a plurality of electromagnetic devices including air core coils and magnetic poles for supporting the movable body and controlling the movable body along a plurality of axes. When the part is inserted into the hole formed in the member, an external force which acts upon the part and the position of a point at which the part contacts the member are estimated by a control unit via position sensing means incorporated in the hand. Currents supplied to the excitation coils of the electromagnetic devices are controlled on the basis of the estimate to adjust the state (position and attitude) of the insertable part, whereby the part is fitted into the hole smoothly and automatically.

5 Claims, 20 Drawing Sheets

PRIOR ART Fig. 1
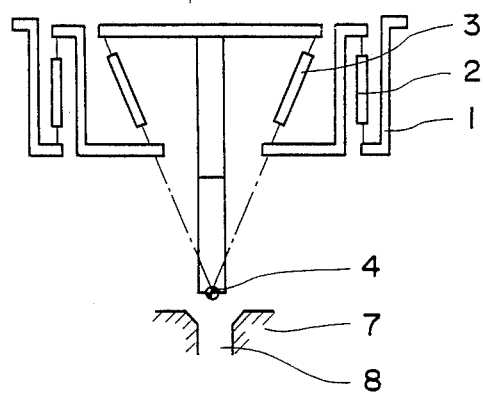
PRIOR ART Fig. 2
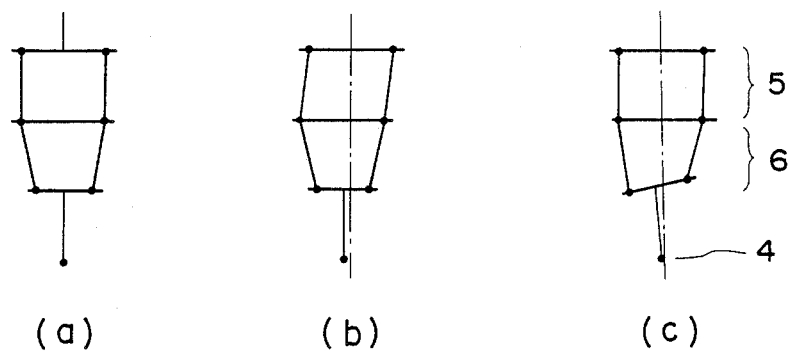
(a)  (b)  (c)

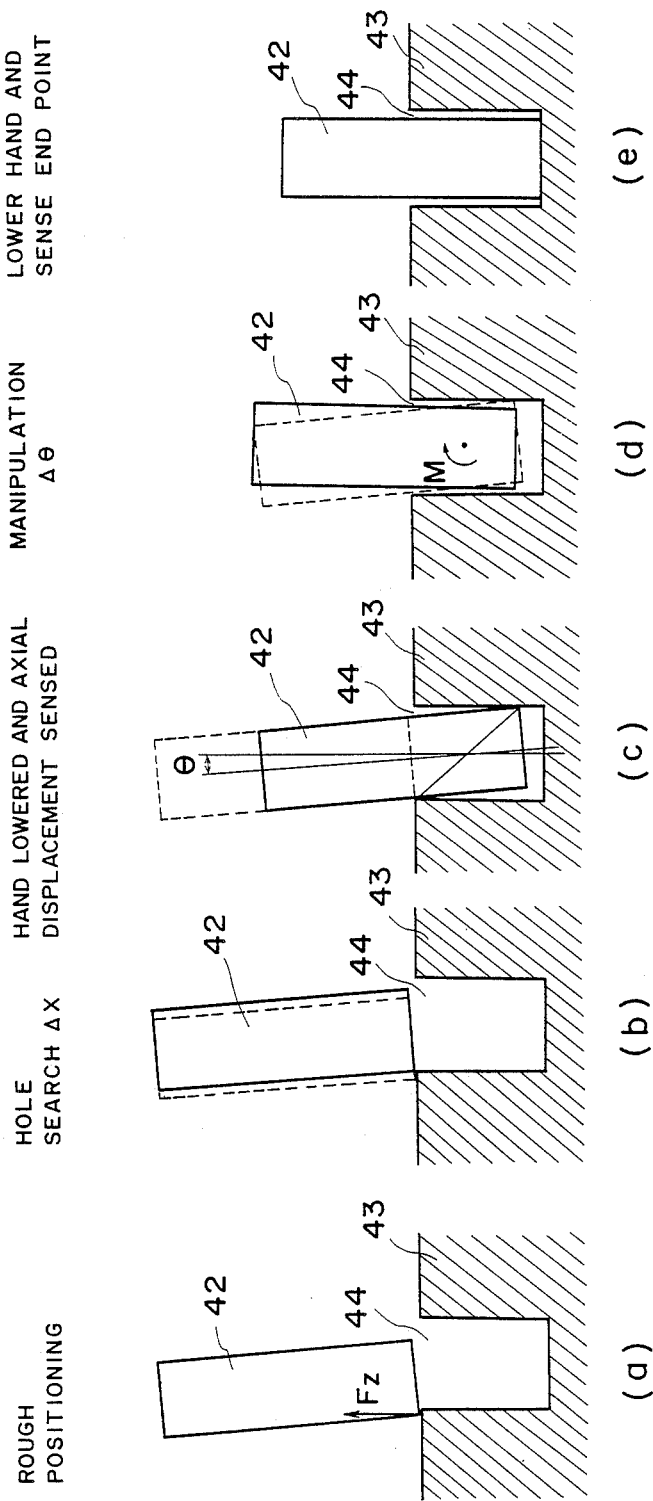

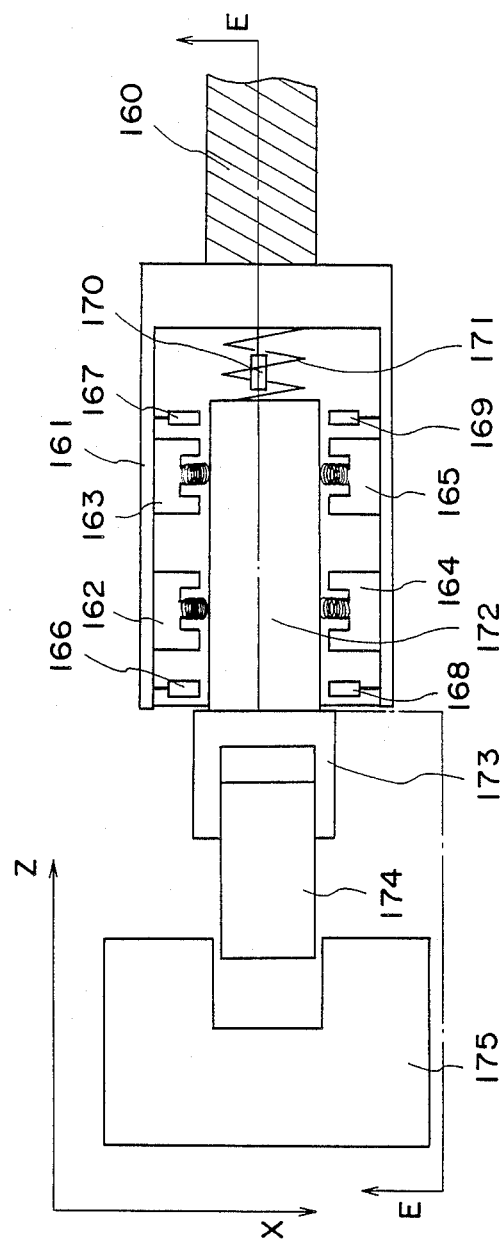
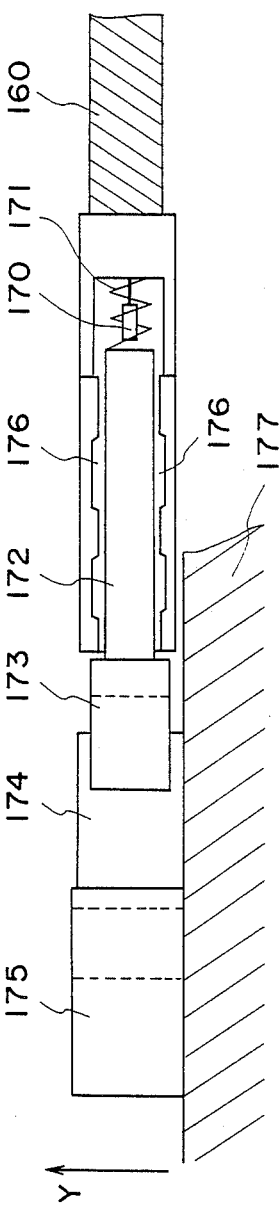
Fig. 31
Fig. 32

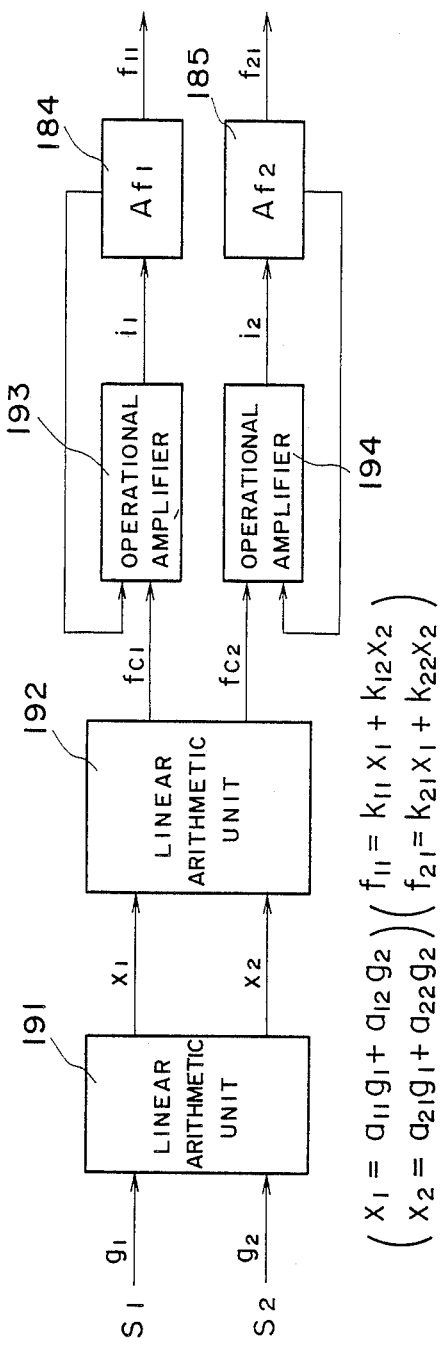

PRECISION AUTOMATIC ASSEMBLY APPARATUS INCLUDING AIR CORE COILS AND CORRESPONDING MAGNETIC POLES

This is a division, of application Ser. No. 037,919 filed Apr. 13, 1987, pending.

BACKGROUND OF THE INVENTION

This invention relates to a precision automatic assembly apparatus, and to an assembly method using the apparatus, for performing a basic task such as pin erection automatically and in an accurate manner.

The insertion of pins into holes formed in parts can be performed without difficulty providing that the insertion operation is carried out under a condition where the pins are positioned to be vertical with respect to the corresponding holes and in such a manner that the pin centers coincide with the hole centers. However, automating an actual operation of this kind is accomplished by using a robot or automatic assembly machine in which highly precise positioning and inclination control are difficult to achieve. The smaller the clearance between the pin and hole, the greater the difficulty becomes. Briefly stated, the problems are as follows: (1) It is difficult to bring the centers of the pin and hole into alignment. (2) A mechanism for grasping the pins is required and involves difficulty in eliminating pin inclination error. (3) It is required that each pin be lowered into the corresponding hole along the central axis of the hole, but it is difficult to lower the pin exactly along the vertical. These problems are a source of error in the pin erecting operation.

Unless the foregoing problems are solved, the pins cannot be inserted into the holes and can cause scoring of the holes along their length.

To this end, a hand has been developed for the purpose of bringing a pin and hole into relative registration and correcting the error in pin attitude (inclination).

One example of such a technique is to provide the hand with flexibility so that a pin can be registered with a hole automatically (passively). A typical example of such an arrangement is an RCC (remote center compliance) system in which mechanisms and springs are specially designed to readily move in a direction which will automatically reduce a positional offset between a pin and hole and an error in inclination during the process of inserting the pin.

The construction of an RCC hand of this kind will now be described with reference to FIGS. 1 and 2.

As shown in FIGS. 1 and 2, the RCC hand mechanism includes a portion 1 joined to a hand, a transverse compliance link 2, a rotational compliance link 3, a compliance center 4, a translational portion 5, a rotational portion 5, a table 7 and a hole 8 provided in the table 7.

This arrangement is suitable for an operation in which a pin is inserted into a chamfered hole with a small clearance and comprises, in combination, the translational portion 5 composed of links forming a parallelogram and the rotational portion 6 composed of links forming a trapezoid. FIG. 2 illustrates the links as they would appear if shown in series. The pin to be inserted into the hole is attached to the lower end of the combined links. Accordingly, if a vertically directed force acts upon the pin, the pin will move in the direction of the applied force while its attitude is maintained, owing to the motion of the links forming the parallelogram. When a rotational force is applied, the links forming the trapezoid act about the compliance center 4, whereby the pin undergoes rotational motion. Thus, if the hole 8 is chamfered and the lower end of the pin abuts against the chamfered portion, the pin is acted upon by a transversely directed force and is moved in the direction of the hole center at the same time that it is urged into the hole. If the pin is inserted at an incline, rotational motion is produced about the compliance center 4 so that the pin is moved in a direction that will bring its center line into coincidence with the center line of the hole.

Examples of an RCC mechanism of an above-described type are disclosed in e.g. the specifications of U.S. Pat. No. 4,098,001, U.S. Pat. No. 4,439,926 and U.S. Pat. No. 4,477,495 (U.S. Cl. 33).

In accordance with the aforementioned prior art, the dimensions of the mechanism and the distribution of the spring constants are so decided that the center position of the RCC hand will agree with the tip of the pin. If the length of the pin to be inserted is changed, therefore, the RCC hand will no longer be effective. In other words, it is necessary to use an RCC hand specially designed for the particular activity, so that the hand lacks versatility. In addition, since the springs used have considerably flexibility, vibrations occur when the pin is moved to approach the hole. As a result, the speed of the overall assembly operation declines and the efficiency of the operation suffers.

SUMMARY OF THE INVENTION

The present invention has been devised to eliminate the foregoing problems and its object is to provide a precision automatic assembly apparatus, as well as an assembly method using the apparatus, through which an assembly operation can be performed precisely and automatically.

According to the present invention, the foregoing object is attained by a precision automatic assembly apparatus provided with a hand incorporation an electromagnetic-type wrist mechanism in which a plurality of electromagnetic devices are arranged for supporting a movable body to which an insertable part is attached and for controlling the insertable part along a plurality of axes. In the process of inserting the part into a hole formed in a member, an external force which acts upon the part and a position on the part at which it contacts the member are estimated on the basis of at least the values of currents flowing through excitation coils in the electromagnetic devices incorporated in the hand. Thus, the attitude and position of the part may be passively adjusted by the electromagnetic-type wrist mechanism in order to insert the part smoothly. The foregoing object is also attained by providing a method using this apparatus.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

FIG. 1 is a schematic view illustrating the construction of an RCC mechanism according to an example of the prior art;

FIGS. 2(a)–(c) are a view for describing the operation of the RCC mechanism of FIG. 1;

FIGS. 7(a)-(e) are a view illustrating a process through which a pin is inserted into a hole;

FIG. 31 is a sectional view of an automatic assembler hand representing another embodiment of the present invention;

FIG. 32 is a view of the actuator as seen in the direction of arrows E—E of FIG. 31;

FIG. 36 is a circuit diagram illustrating a circuit combined with the electromagnetic-type RCC mechanism.

DESCRIPTION OF THE PREFERRED EMBODIMENTS

Preferred embodiments of the present invention will now be described with reference to the accompanying drawings.

Figure 3:
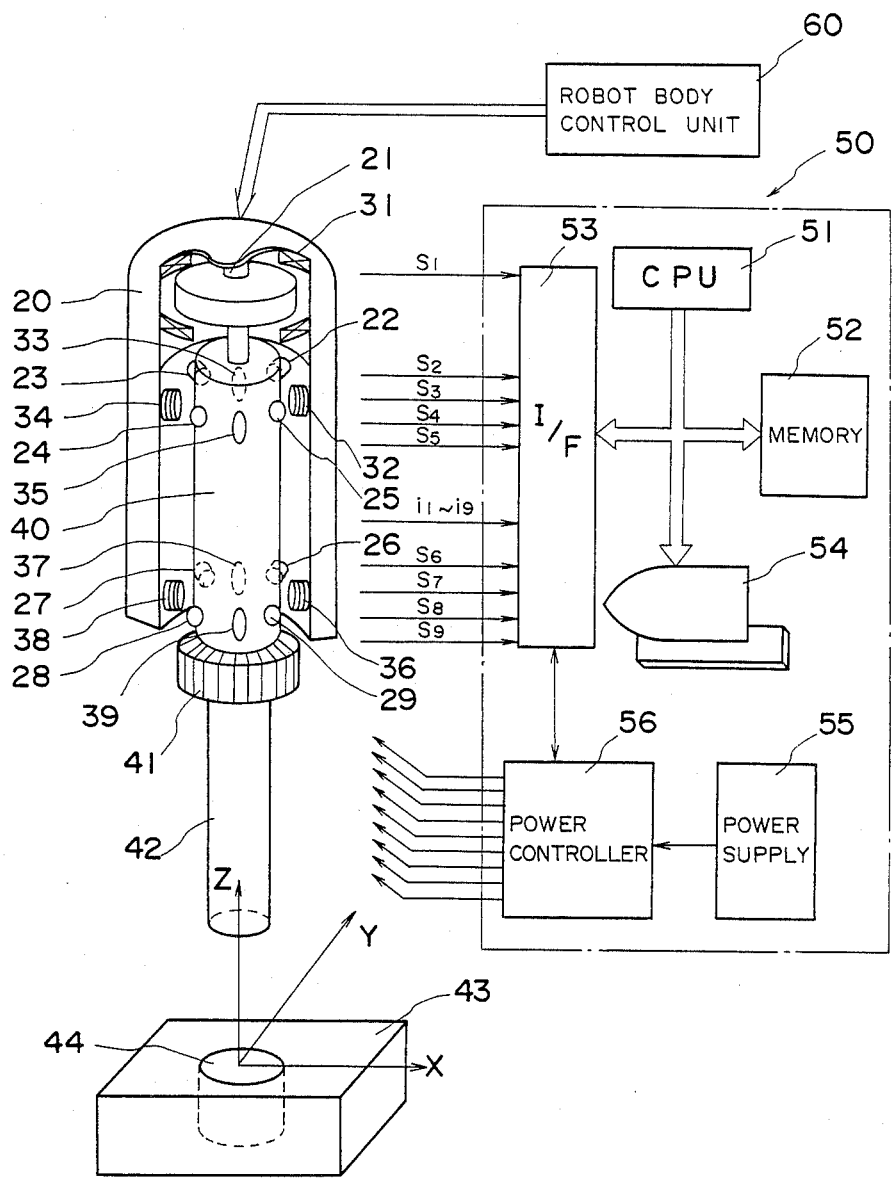
FIG. 3 is a schematic block diagram showing the entirety of a precision automatic assembly apparatus representing a first embodiment of the present invention.
Figure 4:
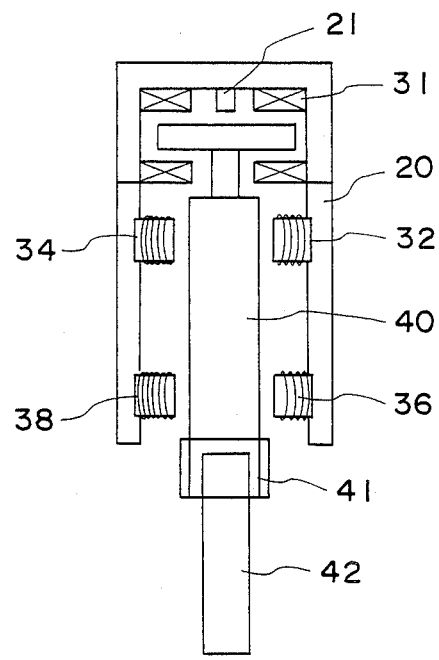
FIG. 4 is a sectional view illustrating an assembler hand of the precision automatic assembly apparatus shown in FIG. 3.
Figure 5:
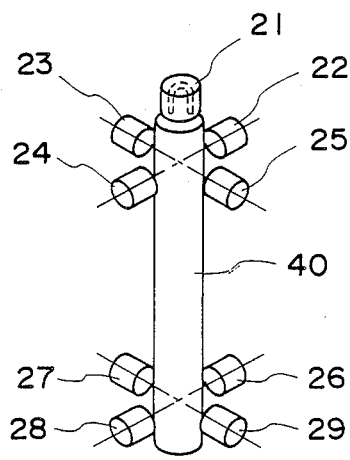
FIG. 5 is a perspective view illustrating the arrangement of gap sensors incorporated in the assembler hand and serving as devices for detecting the position of a movable body.

As shown in FIGS. 3 through 5, numeral 20 denotes the outer frame of a hand incorporating a five-axis control magnetic bearing-type wrist mechanism. Within the outer frame are a first gap sensor 21 serving as a position detector for detecting the position of a movable body along the Z axis, second through fifth gap sensor 22–25 forming two sensor pairs provided on a stationary side on the same plane opposing the upper side of the movable body, and sixth through ninth gap sensors 26–29 forming two sensor pairs provided on a stationary side on the same plane opposing the lower side of the movable body. An electromagnet 31 controls the position of the magnetic body along the Z axis, and eight electromagnetics forming four pairs control the position of the movable mody in the radial direction as well as the inclination of the rotational axis of the body. The movable body, shown at numeral 40, is supported by these electromagnets 31 through 39. Provided on the lower end of the movable body 40 is a chuck 41 in which a pin 42 is loaded. Numeral 43 denotes a member set on a table and having a hole 44 in which the pin 42 is to be inserted. The five-axis control magnetic bearing-type wrist mechanism is controlled by a controller 50. The controller 50 includes a CPU (central processing unit) 51, a memory 52, an input/output interface 53, an input-/output unit 54 having a display, a power supply 55, and a power control section 56 connected to the power supply 55 and input/output interface 53. The output side of the power control section 56 is connected to the electromagnets 31 through 39, each of which has an excitation coil. Excitation currents $i_1$–$i_9$ of these excitation coils can be read into the controller 50. Numeral 60 denotes a robot body control unit for controlling the hand.

Thus, the five-axis control magnetic bearing-type wrist mechanism is so adapted that the attitude of the movable body 40 is sensed by the gap sensor 21 through 29, with all five degrees of freedom being passively controlled with the exception of rotational motion about the central axis of the movable body 40.

The forces acting upon the movable body 40 and the associated coordinate system will now be described.

Figure 6:
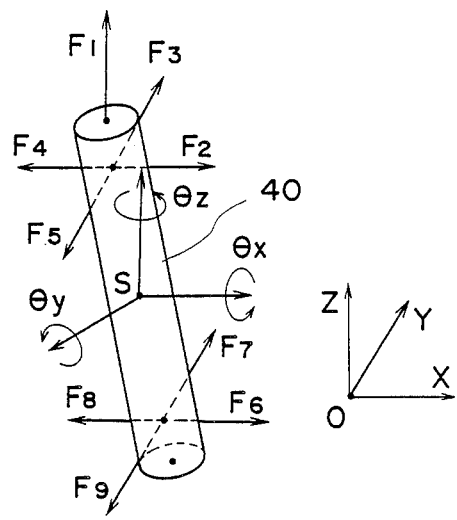
FIG. 6 is a view useful in describing forces acting on the movable body as well as coordinate axes.

As shown in FIG. 6, the movable body 40 supported by magnetic floating means is a rigid body having axial symmetry with respect to the center of gravity S of the body. With the position of the center of movable body 40 serving as the origin when the movable body is at equilibrium, a coordinate system $O_{-xyz}$ fixed in space is decided in such a manner that the rotational axis of the body coincides with the Z axis. Let $F_k$ ($k=1, \ldots 10$)

represent the attractive* force of each electromagnet acting upon the movable body 40, in which $F_1$ is a force lifting the movable body 40 and produced by the electromagnet which controls the position of the body along the Z axis, and $F_2$ through $F_9$ are forces that act upon the movable body 40 at points a prescribed distance away from the center of gravity along the rotational axis. The forces $F_2$, $F_4$, $F_6$ and $F_8$ act along the X axis and are produced by the electromagnets 32, 34, 36 and 38, respectively. The forces $F_3$, $F_5$, $F_7$ and $F_9$ act along the Y axis and are produced by the electromagnets 33, 35, 37 and 39, respectively.

It is well-known that the attractive force of an electromagnet acting on an object is expressed by the following equation:

$$F \approx B^2 A/2\mu_0 \qquad (a)$$
$$\approx (\mu_0 A/8)(NI/x)^2$$
$$= K_F(I/x)^2$$

where
B: magnetic flux density,
A: magnetic pole area,
$\mu_0$: space permeability,
N: number of turns,
I: current,
x: gap (electromagnet - object distance),
$K_F$: $(\mu_0 A N^2)/8$ An example of the operation of this precision automatic assembly apparatus will now be described in terms of the X-Z plane while referring to FIGS. 3 and 7. In actuality, the phenomenon can be grasped in the form of a vector sum with the Z-Y plane.

First, prior to the operation for inserting the pin 42, the table (not shown) to which the member 43 having the hole is attached is roughly positioned in the X and Y directions by moving mechanism in order that the center positions of the pin 42 and hole 44 may be brought into registration within a certain error range.

The robot hand having the five axis-control magnetic bearing-type wrist mechanism of the invention is lowered to bring the pin 42 into abutting contact with the member 43, as shown in (a) of FIG. 7, whereby the pin 42 is roughly positioned. The fact that the pin 42 has contacted the member 43 is sensed in the form of an output signal $S_1$ from the first gap sensor 21, which senses a change in distance along the Z axis caused by a reaction force $F_z$ acting upon the movable body 40 due to the contact made with the member 43.

Figure 8:
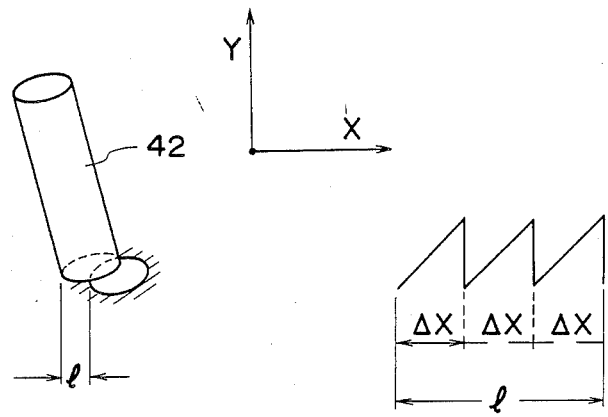
FIG. 8 is a view for describing a hole search process in the pin insertion operation.

Next, as shown in (b) of FIG. 7, the pin 42 is dropped into the hole 44 of member 43. In other words, the pin is made to search for the hole 44. This is accomplished by manipulating the pin 42 over a small incremental distance $\Delta x$, namely by strengthening the excitation currents of the electromagnets 32, 36 and 33, 37 of the five axis-control magnetic bearing-type wrist mechanism of FIG. 3 to move the pin 42 a minute distance in a direction intermediate the electromagnets via the movable body 40 (FIG. 1), and further by strengthening the excitation currents of the electromagnets 35, 39, shown in FIG. 3 to rock the pin in the -Y direction, as shown in FIG. 8. This procedure is repeated to shift the pin 42 in increments of $\Delta x$ until the hole 44 has been searched out. The fact that the hole 44 has been found is detected by sensing that the reaction force $F_z$ acting upon the movable body 40 connected to the pin 42 has vanished by virtue of the pin 42 falling into the hole 44.

The disappearance of the reaction force $F_z$ is sensed in the form of the output signal $S_1$ from the first gap sensor 21, which is for sensing position along the Z axis.

When the hole 44 has thus been located, the hand is moved in the -Z direction to insert the pin 42 while observing whether the pin 42 is scoring the wall of the hole 44.

If the pin 42 scores the wall of the hole 44, as shown in (c) of FIG. 7, the reaction force $F_z$ resulting from contact with the member 43 again acts upon the movable body 40. This condition is sensed in the form of the output signal $S_1$ from the first gap sensor 21 sensing position along the Z axis. The inclination $\theta$ of pin 42 is detected based on distance l along the Z axis from the moment the hole 44 is located until the moment the pin 42 scores the hole 44, and the clearance $\Delta w$ between the pin 42 and hole 44. This inclination $\theta$ is corrected as shown in (d) of FIG. 7.

Next, when the pin 42 reaches the bottom of the hole 44 after the correction, as shown in (e) of FIG. 7, the fact is sensed in the form of the output signal $S_1$ from the first gap sensor 21 for sensing position along the Z axis.

Thus, the pin insertion operation can be performed automatically and in an accurate manner.

Figure 9:
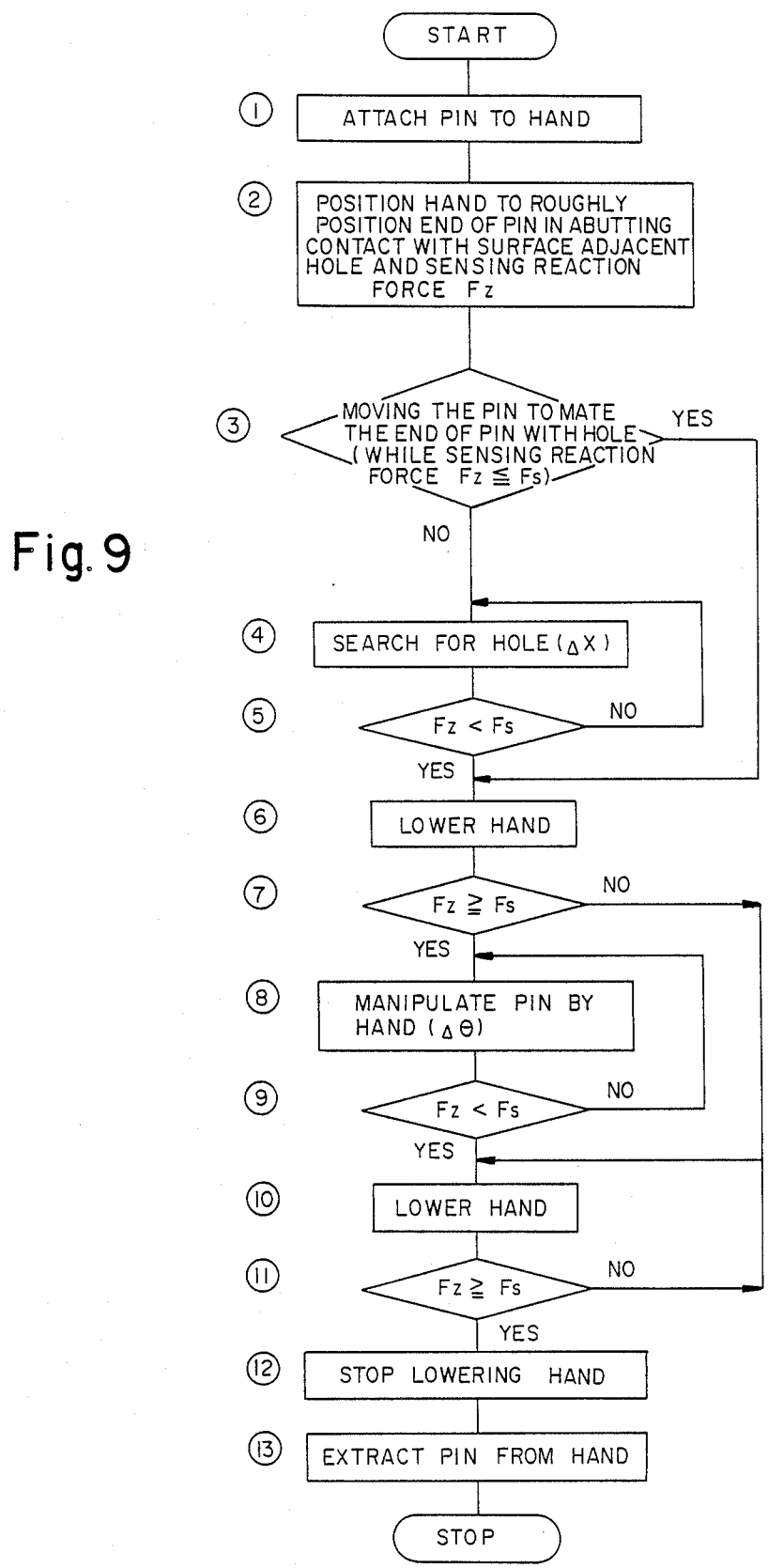
FIG. 9 is a flowchart of a precision automatic assembly operation.

A pin assembly method using the precision automatic assembly apparatus of the invention will now be described in further detail in accordance with the flowchart of FIG. 9.

The clearance value $\Delta w$ between the pin and hole, a threshold value $F_s$ along the Z axis, and a correspondence table between pin inclination $\theta_k$ and the values of the currents distributed among the electromagnets 32 through 39 are stored beforehand in a ROM section of the memory 52 incorporated in the controller 50 of the five axis-control magnetic bearing-type wrist mechanism shown in FIG. 3.

(1) In the first step of the flowchart, the pin is attached to the hand.

(2) The member 43, having the hole 44 therein into which the pin 42 is to be inserted, is roughly positioned and then held in the X, Y and Z directions so that, when the pin 42 is lowered by the axis-control magnetic bearing-type wrist mechanism the end of the pin is in abutting contact with the surface of member 43 within error range proximity to the hole. Then, the hand is moved in the fundamental XYZ coordinate system by the robot body control unit 60, e.g. a numerical control (NC) unit, to roughly position the end of pin, mounted on the hand, in contact with respect to the surface of member 43. When the pin contacts the surface of the member having the hole, the reaction force $F_z$ acts upon the movable body 40. The magnitude of this reaction force $F_z$ is sensed mainly by the first gap sensor 21 which senses position along the Z axis on the basis of the value of current flowing through the excitation coil of electromagnet 31 and is controlled by control unit 60 to maintain the end of pin 42 in contact with the surface of member 43 and the reaction force $F_z$ reaches a certain threshold value $F_s$. The contact end of pin is now in registry with hole 44. Movement of the hand along the Z axis is promptly halted at the moment the relation $F_z > F_s$ is established.

(3) Next, it is determined whether the pin has mated with the hole. This determination is made based on the reaction force $F_z$. When the pin and the hole are mating, the program proceeds to a step (6).

(4) If the pin is not mated with the hole, then a search is performed to find the hole. The search is carried out by incrementally shifting the pin by $\Delta x$, as shown in FIG. 8, by way of example.

(5) It is determined whether the hole has been found, i.e. whether the reaction force $F_z$ is less than the threshold value $F_s$ ($F_z < F_s$).

(6) If there is a transition from the state $F_z \geq F_s$ to the state $F_z < F_s$, indicating that the hole has been found, the Z-axis position $Z_1$ prevailing at this instant is read in and stored in memory 52, and the hand is lowered.

(7) It is determined during the lowering of the hand whether the pin is scoring the wall of the hole, i.e. whether there is a transition from the state $F_z < F_s$ to the state $F_z \geq F_s$.

(8) When there is a transition to the state $F_z \geq F_s$, a Z-axis position $Z_2$ which prevails at this time is read in and the CPU 51 calculates an arithmetic difference between $Z_1$ and $Z_2$ to obtain a travel distance $Z_D$ along the Z axis. Pin inclination $\theta_1$ prevailing at this time is obtained based on the travel distance $Z_D$ and the clearance value $\Delta w$, stored in memory 52, between the pin and the hole.

(9) By manipulating the pin via the wrist mechanism, the electric currents applied to the excitation coils of the electromagnets are distributed in such a manner that the pin inclination $\theta_1$ is reduced, thereby correcting the pin inclination $\theta_1$. The inclination $\theta_1$ is corrected promptly by using the previously stored table of pin inclination $\theta_k$ and current values distributed to the electromagnets 32 through 39. More specifically, the direction and magnitude of inclination can be estimated from the clearance $\Delta w$ and travel distance $Z_D$ of the hand from the start of first contact to the occurrence of second contact. Then, by taking the center of the two points of contact as a fixed point, the inclination of the pin is corrected about this point in such a manner as to reduce the inclination.

(10) When the inclination $\theta_1$ of the pin has been corrected, the hand is lowered again just as set forth above.

(11) It is determined whether the lower end of the pin has contacted the bottom of the hole, namely whether there is a transition from the state $F_z < F_s$ to the state $F_z \geq F_s$.

(12) If there is a transition to the state $F_z \geq F_s$, then lowering of the hand is halted. If no scoring of the wall by the pin is encountered while the pin is being lowered by the robot hand into the hole and the pin travel distance $Z_D$ is at its maximum, lowering of the hand is halted.

(13) The pin is then detached from the hand.

In the above embodiment, the case described is one in which the pin is inserted into a hole formed in the member so as to have the shape of a circular cylinder. Described in detail next will be a case where a pin is inserted into a hole which has been chamfered.

Figure 10:
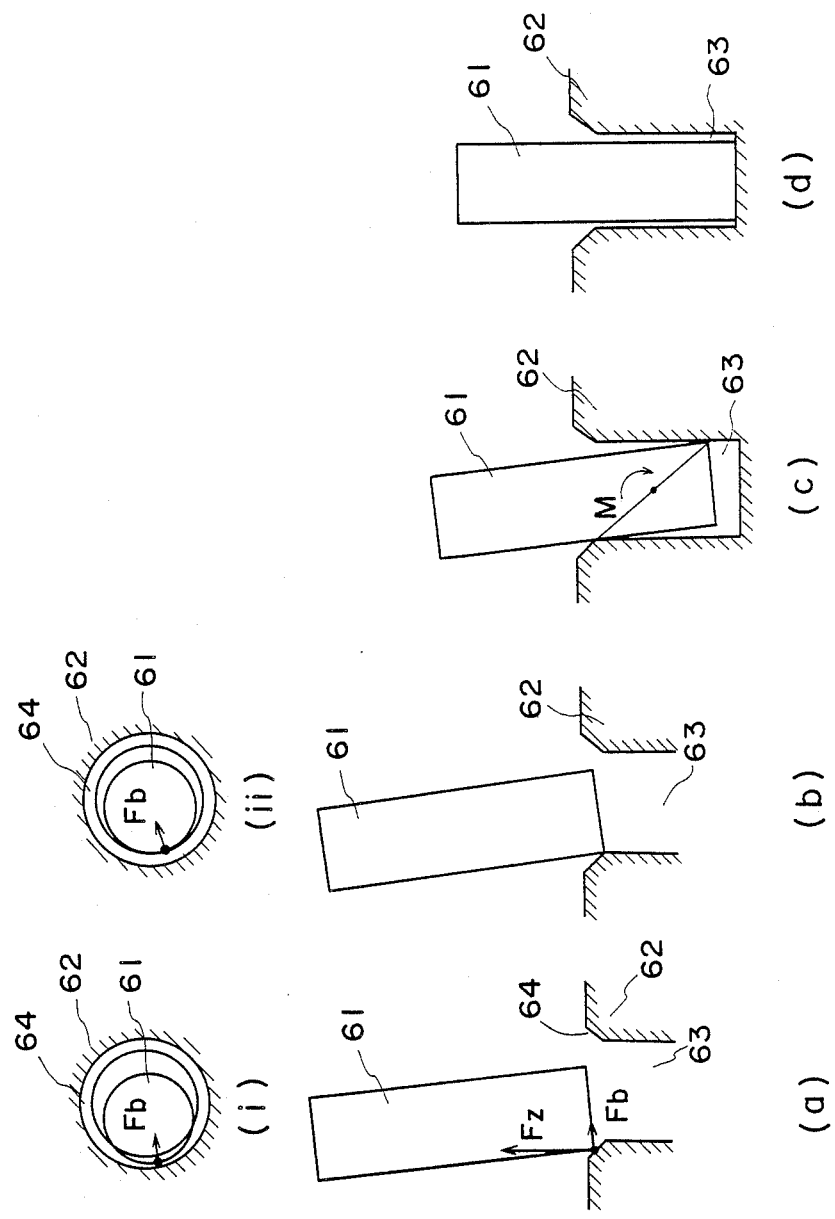
FIGS. 10 (i), (ii), and (a)-(d) are a view for describing an operation in which a pin is inserted into a chamfered hole.

FIG. 10 is useful in describing an operation for inserting a pin into a chamfered hole, in which (a) through (d) are sectional views showing the insertion process, (i) is a plan view of the situation shown in (a), and (ii) is a plan view of the situation shown in (b).

First, as shown in (a) and (i) of FIG. 10, a hole 63 in a member 62 is provided with a chamfered portion 64. The pin 61 is roughly positioned by bringing one point on the circumference of its lower end into contact with the chamfered portion 64. Note that if the pin 64 does not contact the chamfered portion and is roughly positioned on the outer side thereof, then the pin is manipulated to find the chamfered portion 64 by performing the hole search procedure [the above-described step (4)], which in this case actually means searching for the chamfered portion. Recently, however, robots can come equipped with a vision sensor for the purpose of improving positioning precision. If such a robot is used herein, the pin 61 usually can be brought into contact with the chamfered portion 64 at the rough positioning stage.

In this case, one point on the circumference of the lower end of pin 61 is placed upon the conical surface of the chamfered portion 64, as a result of which a reaction force $F_z$ along the Z axis (thrust direction) and a reaction force $F_b$ in the radial direction pointing toward the center of the hole 63 act upon the pin 61. These reaction forces are calculated by the CPU 51 on the basis of the aforementioned Eq. (a) using the excitation current values of the coils in the thrust and radial electromagnets and the gap values from the gap sensors, these current values and gap values being read into the controller 50 via the interface 53. This will now be described in detail.

Figure 11:
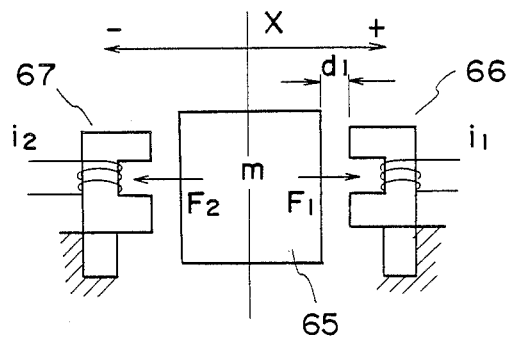
FIG. 11 is a schematic view of a magnetic bearing.

Assume that a movable body 65 to be supported has a mass m and is supported by a pair of electromagnets 66, 67 constituting an electromagnetic device, as shown in FIG. 11. Let us consider one of these electromagnets acting upon the movable body 65. As indicated in Eq. (a) above, the attractive force F of the electromagnet is generally expressed as follows:

$$F = f(i,d)$$

where
i: current flowing into the electromagnet,
d: gap between the electromagnet and movable body The function f is decided by such factors as the shape, dimensions and material of the electromagnet and movable body. The above equation ordinarily can be approximated as follows:

$$F = f(i,d) = K \cdot i^p / d^\sigma \quad (1)$$

Letting $i_0$ represent the current and $d_0$ the gap when the movable body 65 is in the equilibrium state, Eq. (1) can be linearized as follows:

$$F = F_0 + K_i \Delta_i - K_d \Delta_d \quad (2)$$

In Eq. (2), $F_0 = K \cdot i_0^p / d_0^\sigma$, $i = i_0 + \Delta_i$, $d = d_0 + \Delta_d$, and $\Delta i$, $\Delta d$ are minute amounts of fluctuation. Further, $$K_i = \partial f / \partial i = pK \cdot i_0^{(p-1)} / d_0^\sigma$$

$$K_d = \partial f / \partial d = \sigma K \cdot i_0^p / d_0^{(\sigma+1)}$$

Returning now to FIG. 11 where the movable body 65 of mass m is supported by the pair of electromagnets 66, 67, and focusing attention solely on the X direction, we have $$\begin{aligned} m\ddot{x} &= F_1 - F_2 \\ &= K_i(\Delta i_1 - \Delta i_2) - K_d(\Delta d_1 - \Delta d_2) \end{aligned} \quad (3)$$

where $\Delta i_1 - \Delta i_2 = e$. Assuming that $x = 0$ represents the equilibrium state on the basis of the positional relationship, we have $$\Delta d_1 - \Delta d_2 = -2x$$

In other words, if x increases, $\Delta d_1$ decreases and $\Delta d_2$ increases. Accordingly, Eq. (3) becomes $$\ddot{m}x = K_i e + 2K_d x \quad (4)$$

If the displacement x is sensed and, as a result thereof, it is arranged so that e satisfies the relation $$e = -(Ax + Bx) \quad (5)$$

then Eq. (5) becomes $$\ddot{m}x + K_i Bx + (K_i A - 2K_d)x = 0 \quad (6)$$

By adjusting gain A in such a manner that $(K_i A - 2K_d) > 0$ holds, the movable body can be supported stably. In addition, any rigidity characteristic can be set by adjusting the gain A. Damping characteristic is controlled by adjusting gain B.

Estimation of the acting electromagnetic forces will be described next.

The force F of magnetic attraction acting on the movable body to be supported is expressed by $F = f(i,d)$, as set forth above. Therefore, the attractive force F acting on the movable body 65 can be obtained by measuring i and d. More specifically, $f(i,d)$ is determined experimentally, K, $\rho$, $\sigma$ in Eq. (1) are determined experimentally, and F can be obtained from i, d using this approximation equation.

Alternatively, a method can be adopted in which a ROM is prepared having F written in as representative points of i and d, with F then being found by interpolation using these data.

Figure 12:
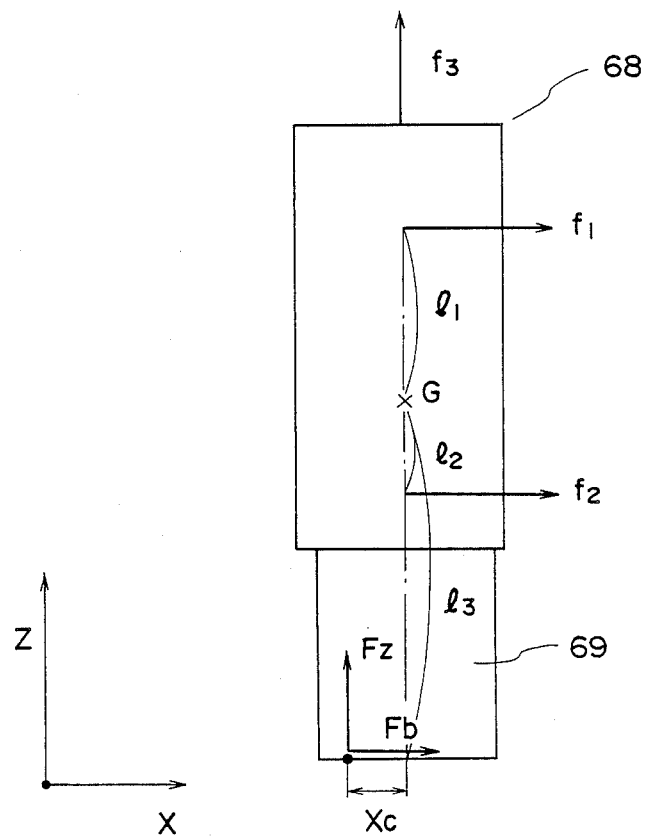
FIG. 12 is a view for describing a technique through which an external force acting on a pin and a point of contact on the pin are estimated.

Reference will be had to FIG. 12 to describe a method of estimating the magnitudes and operating points of forces acting on a movable body to be supported.

The discussion will be limited to one plane, namely the X-Z plane. Furthermore, a pin 69 is attached the lower end of a movable body 68 to be supported, and the position of the center of gravity G is adopted as the origin of the coordinate system.

The equilibrium state will be taken to be that which prevails when the movable body 68 is supported in a state free of mechanical contact by means of electromagnets constituting an electromagnetic device.

When the end of the pin 69 makes contact, this is sensed and feed along the Z axis is halted. With the pin 69 held in this state, a change $f_1$ from the equilibrium state of the radial supporting force due to the upper electromagnets, a change $f_2$ from the equilibrium state of the radial supporting force due to the lower electromagnets, and a change $f_3$ from the equilibrium state of the supporting force due to the electromagnet acting in the thrust direction can be obtained based on the gap detection values from the gap sensors and the current values of the electromagnet coils.

Let $l_1$ represent the distance from the center of gravity G to the operating point of $f_1$, and let $l_2$ represent the distance from the center of gravity G to the operating point of $f_2$. It is known that $l_1$, $l_2$ can be structurally determined. Moreover, a change in the relative positions of the movable body and electromagnets is very small, so that $l_1$, $l_2$ may be considered to be non-variable. Let the $+Z$ direction be positive and the $-Z$ direction negative. We then find $F_z$, $F_b$ and $x_c$.

From the balance of forces, we have $$f_1 + f_2 + F_b = 0$$

$$f_3 + F_z = 0$$

$$f_1 l_1 + f_2 l_2 + F_z x_c + F_b l_3 = 0$$

From the above we obtain the following:

$$F_z = -f_3$$
$$F_b = -(f_1 + f_2)$$
$$x_c = (f_1 l_1 + f_2 l_2 - f_1 l_3 - f_2 l_3)/-f_3$$
$$= [(l_3 - l_1)f_1 + (l_3 - l_2)f_2]/f_3$$

It will be appreciated from the foregoing equations that it will suffice to determine $(l_3 - l_1)$, $(l_3 - l_2)$. The end result is that it is unnecessary to know the position of the center of gravity of the movable body 68. This means that even if there is a change in the mass and length of the pin 69, all that need be done is to determine its length.

Thus, the magnitudes of $F_z$, $F_b$ and the positions of the points of contact can be estimated from the equilibrium equations of the supporting forces of each element. In other words, it is possible for the first time to estimate the above under a condition where a body supported in a completely contactless state by electromagnets is allowed to come into mechanical contact with an object solely at a single point on the body.

Next, returning to FIG. 10, the pin 61 is manipulated into the hole on the inner side of the chamfered portion 64 by the hole search procedure described above [step (4)]. When the pin 61 reaches the interior of the hole on the inner side of the chamfered portion, as shown in (b) of FIG. 10, there is a transition from the state $F_z \geq F_s$ to the state $F_z < F_s$. The hand is lowered upon sensing this condition [step (6) described above].

Next, as shown in (b) of FIG. 10, the pin 61 is inserted into the hole 63 while monitoring whether the end of the pin is scoring the wall of the hole.

Thereafter, the pin insertion operation is carried out in accordance with the aforementioned steps (7) through (13), as shown in (c) and (d) of FIG. 10.

The manner in which the pin is roughly positioned is set forth hereinbelow. In the case described, rough positioning is set in such a manner that the pin is brought into position from the left side of the hole as much as practicable.

Figure 13:
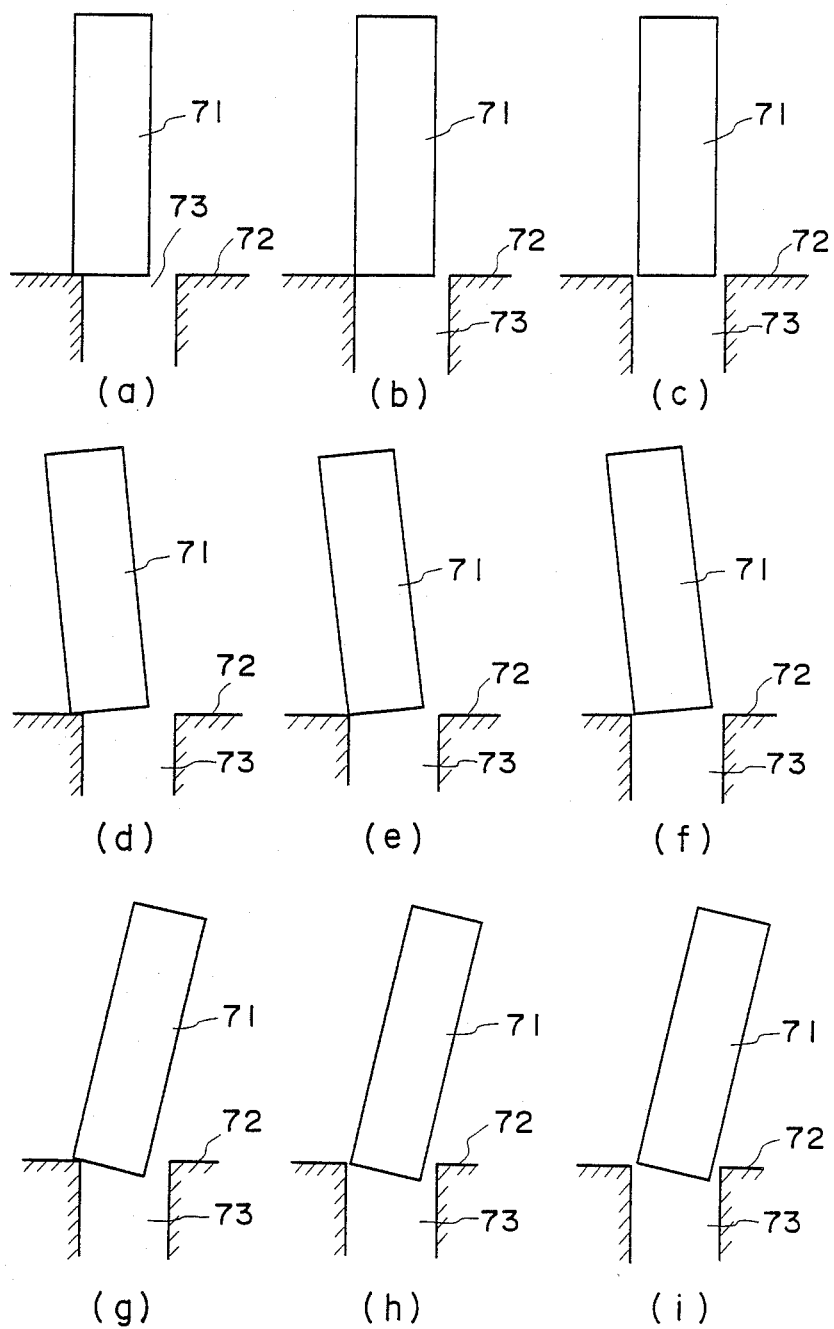
FIGS. 13(a)-(i) are a view for describing the manner in which a pin is roughly positioned with respect to a chamferless hole.

[I] For a member having a chamferless hole (1) As shown in FIG. 13(*a*), assume a case where a pin 71 is in an upright attitude with a portion thereof resting upon the surface of a member 72. In this case, it is necessary to search for a hole 73 in accordance with step (4) described above.

(2) As shown in FIG. 13(*b*), assume that the pin 71 is in an upright attitude with one point on the circumferential portion thereof contacting the corner of the hole 73. In this case, the hand is lowered [the aforementioned step (6)] without requiring a search for the hole 73 [the aforementioned step (4)].

(3) As shown in FIG. 13(*c*), assume a case where the pin 71 is in the upright attitude and the central axes of the pin 71 and hole 73 are in alignment. In this case, the pin 71 can be inserted merely by lowering the hand [the aforementioned step (6)].

(4) As shown in FIG. 13(*d*), assume a case where the pin 71 is tilted to the left with a portion thereof resting upon the surface of member 72. In this case, it is necessary to search for the hole 73 [the step (4)], as mentioned above.

(5) As shown in FIG. 13(e), assume a case where the pin 71 is tilted to the left with one point on the circumferential portion thereof contacting the corner of the hole 73. In this case, the hand is lowered [the step (6)] without requiring a search for the hole 73 [the step (4)].

(6) As shown in FIG. 13(f), assume a case where the pin 71 is tilted to the left but conforms to the hole 73. In the case, the hand can be lowered [the step (6)].

(7) As shown in FIG. 13(g), assume a case where the pin 71 is tilted to the right with a portion thereof resting upon the corner of the hole 73. In this case, it is necessary to search for the hole 73 [the step (4)].

(8) As shown in FIG. 13(h), assume a case where the pin 71 is tilted to the right with one point on the circumferential portion thereof contacting the corner of the hole 73. In this case, the hand is lowered [the step (6)] without requiring a search for the hole 73 [the step (4)].

(9) As shown in FIG. 13(i), assume a case where the pin 71 is tilted to the right but conforms to the hole 73. In the case, the hand can be lowered [the step (6)].

[II] For a member having a chamfered hole (1) As shown in FIG. 14(a), assume a case where a pin 75 is in an upright attitude with one point on the circumference thereof contacting a chamfered portion 78. In this case, it is necessary to search for a hole 77 in accordance with step (4) described above.

(2) As shown in FIG. 14(b), assume that the pin 75 is in an upright attitude with one point on the circumferential portion thereof contacting the corner of the hole 77. In this case, the hand is lowered [the aforementioned step (6)] without requiring a search for the hole 77 [the aforementioned step (4)].

(3) As shown in FIG. 14(c), assume a case where the pin 75 is in the upright attitude and the central axes of the pin 75 and hole 77 are in alignment. In this case, the pin 75 can be inserted merely by lowering the hand [the aforementioned step (6)].

(4) As shown in FIG. 14(d), assume a case where the pin 75 is tilted to the left with one point on the circumferential portion thereof contacting the chamfered portion 78. In this case, it is necessary to search for the hole 77 [the step (4)], as mentioned above.

(5) As shown in FIG. 14(e), assume a case where the pin 75 is tilted to the left with one point on the circumferential portion thereof contacting the corner of the hole 77. In this case, the hand is lowered [the step (6)] without requiring a search for the hole 77 [the step (4)].

(6) As shown in FIG. 14(f), assume a case where the pin 75 is tilted to the left but conforms to the hole 77. In the case, the hand can be lowered [the step (6)].

(7) As shown in FIG. 14(g), assume a case where the pin 75 is tilted to the right with one point on the circumferential portion thereof contacting the chamfered portion 78. In this case, it is necessary to search for the hole 77 [the step (4)].

(8) As shown in FIG. 14(h), assume a case where the pin 75 is tilted to the right with one point on the circumferential portion thereof contacting the corner of the hole 77. In this case, the hand is lowered [the step (6)] without requiring a search for the hole 77 [the step (4)].

(9) As shown in FIG. 14(i), assume a case where the pin 75 is tilted to the right but conforms to the hole 77. In the case, the hand can be lowered [the step (6)].

The prevailing condition, whatever it might be, can be determined by monitoring the reaction forces $F_z$, $F_b$ and the hand travel distance $Z_k$ along the Z axis using the controller.

Figure 14:
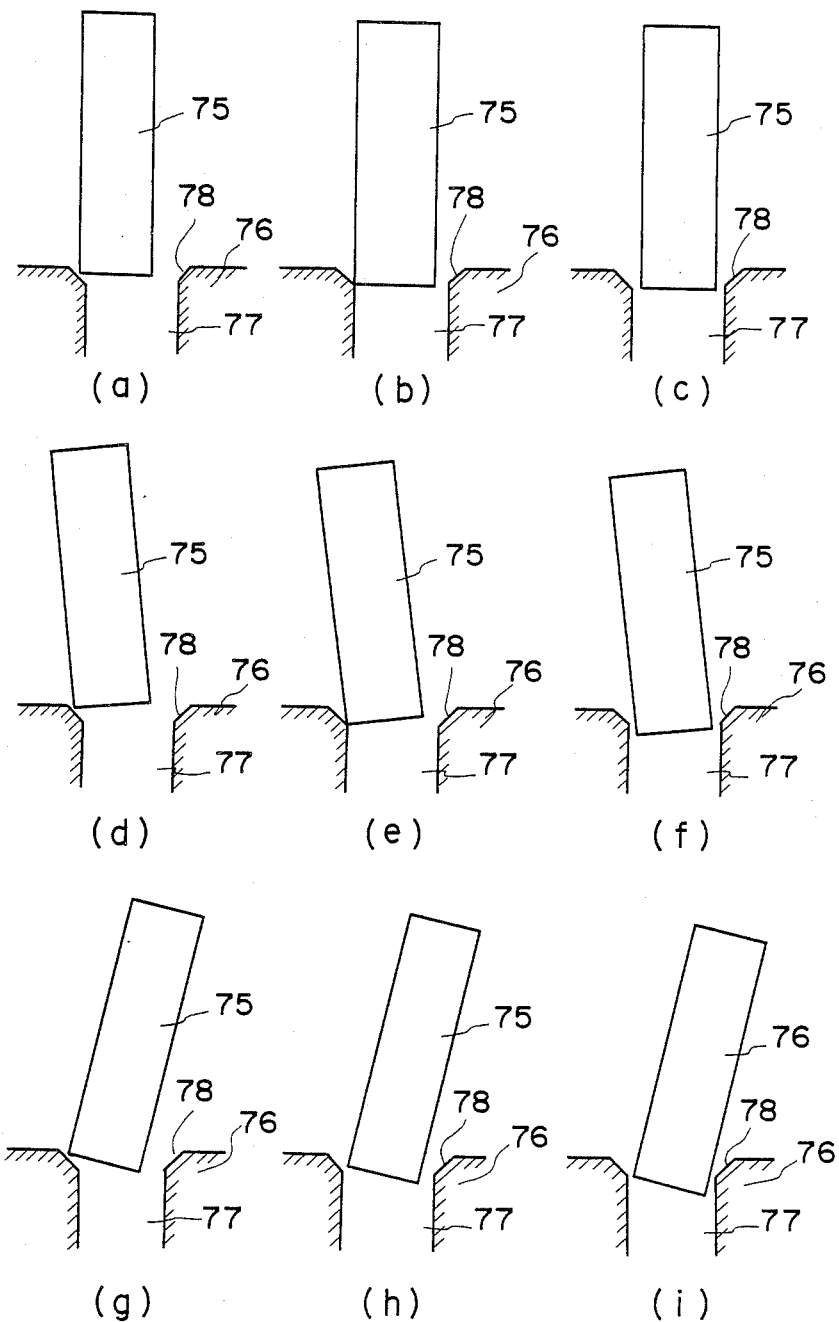
FIGS. 14(a)-(i) are a view for describing the manner in which a pin is roughly positioned with respect to a chamfered hole.

For the conditions shown in (a), (d) and (g) of FIG. 14, it has been described that the hole is searched for in accordance with the aforementioned step (4). However, by using an electromagnetic-type RCC mechanism described hereinbelow, the hole can be searched out and the pin 75 fitted into the hole 77 without relying upon step (4).

In addition, if there is a change in the length of the pin to be inserted, this can be dealt with promptly, without a modification of the mechanism, merely by altering the numerical value from the input/output unit 54 (FIG. 3).

A second embodiment of the present invention will now be described with reference to FIGS. 15 and 16.

Figure 15:
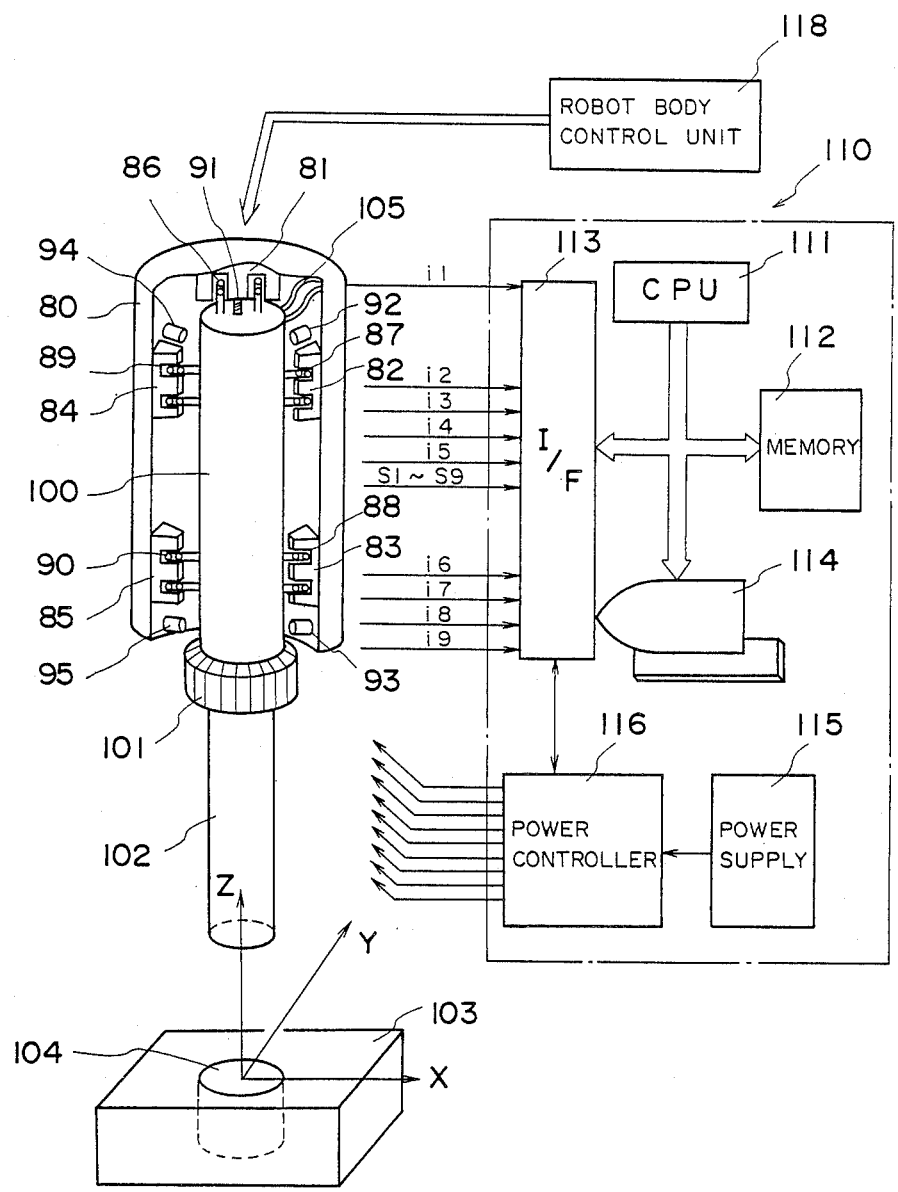
FIG. 15 is a schematic block diagram showing the entirety of a precision automatic assembly apparatus representing a second embodiment of the present invention.
Figure 16:
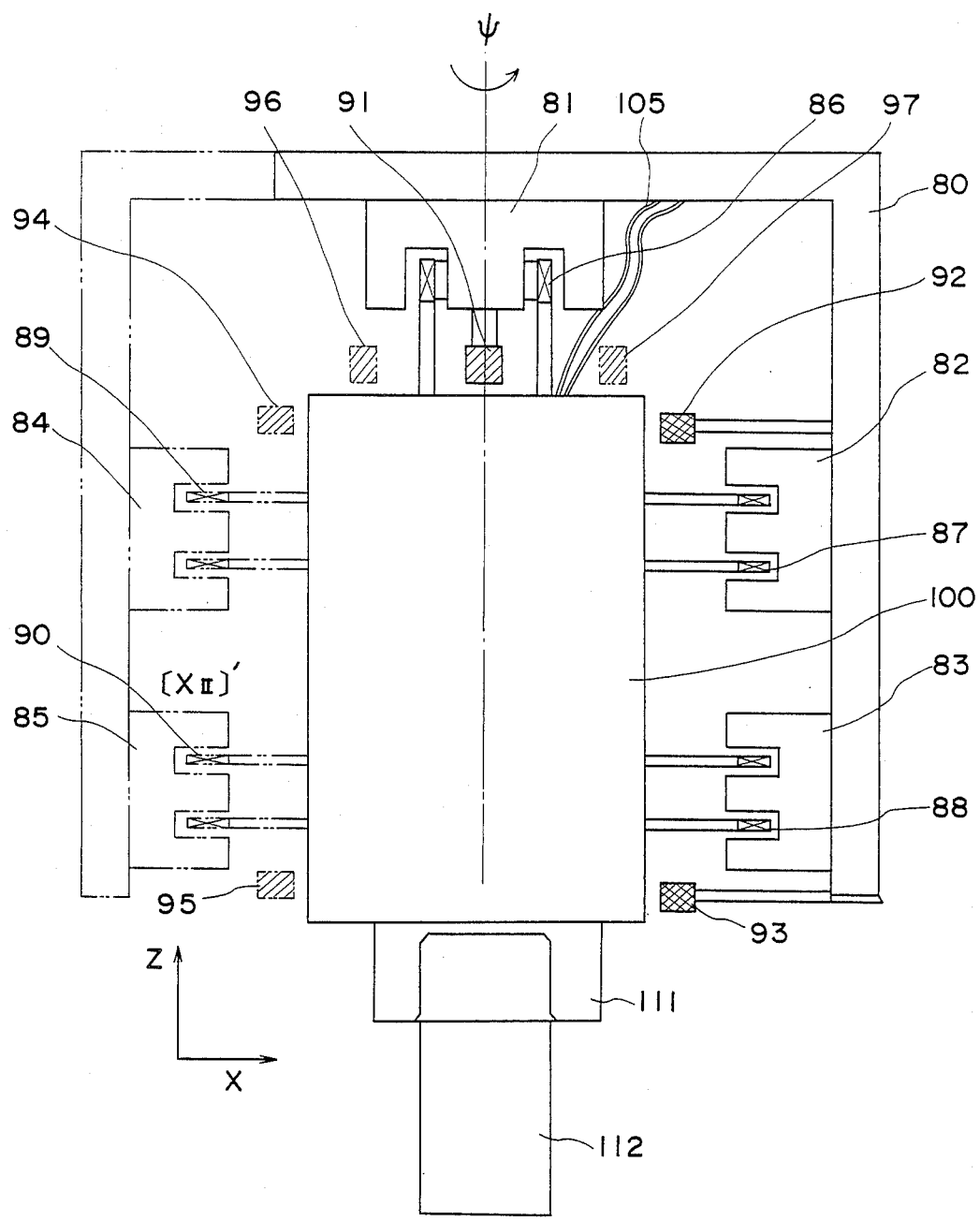
FIG. 16 is a sectional view illustrating an assembler hand of the precision automatic assembly apparatus shown in FIG. 15.

In FIG. 15 and 16, numeral 80 denotes the outer frame of a hand, and numeral 81 denotes a fixed magnetic pole (magnetic circuit) attached to the outer frame 80. The magnetic pole 81 and an air-core coil 86 attached to a movable body 100 construct a linear DC actuator for controlling the movable body 100 along the Z axis. Fixed magnetic poles 82, 84 attached to the outer frame 80 and air-core coils 87, 89 attached to the movable body 100 together construct linear DC actuators for controlling the upper part of the movable body 100 along the X axis. Further, fixed magnetic poles 83, 85 and air-core coils 88, 90 attached to the movable body 100 construct linear DC actuators for controlling the lower part of the movable body 100 along the X axis. The lower part of the movable body 100 is provided with a chuck 101 in which a pin is mounted for being inserted into a hole. Provided inside the outer frame 80 of the hand are a gap sensor 91 for sensing displacement along the Z axis, gap sensors 92, 94 for sensing displacement of the upper part of the movable body along the X axis, and gap sensors 93, 95 for sensing displacement of the lower part of the movable body along the X axis. Though not shown, linear DC actuators for control along the Y axis are arranged at the front and back. It is also permissible to adopt an arrangement in which the Z-axis gap sensor, instead of comprising the centrally provided gap sensor 91, is composed of gap sensors 96, 97 situated at positions to the left and right, in which the average would be taken of the detection values from these sensors. A feeder line 105 for the air-core coils is composed of wiring having a degree of freedom which will not restrict movement of the movable body 100.

It should be noted that even if the portions shown by the broken lines, namely the linear DC actuators on the left side, are deleted, the mechanism can still perform its function satisfactorily by relying upon the linear DC actuators on the right side and on the upper side. However, when a highly precise assembly operation is to be performed, the linear DC actuators and gap sensors are arranged at axially symmetric positions, as illustrated, in order to perform control and gap detection differentially by pairs of linear DC actuators and gap sensors arranged on both sides of the movable body. Further, in the illustrated embodiment, the magnetic poles are arranged on the stationary side and the air-core coils are provided on the movable side. However, the same actions and effects can be obtained by adopting a converse arrangement in which the air-core coils are disposed on the stationary side and the magnetic poles on the movable side. Adopting such an arrangement facilitates the wiring of the feeder lines to the air-core coils. In addition, the fixed magnetic poles 82, 85, or the fixed magnetic poles 83, 84, can be arranged to oppose each other.

In other words, the magnetic poles 82, 85 or 83, 84 can be disposed at different heights from each other.

Numeral 102 denotes a pin mounted in the chuck 101. A member 103 is set on a table and is formed to include a hole 104 into which the pin 102 is to be inserted. This linear DC actuator-type wrist mechanism is controlled by a controller 110. The controller 110 includes a CPU (central processing unit) 111, a memory 112, an input-/output interface 113, an input/output unit 114 having a display, a power supply 115, and a power control section 116 connected to the power supply 115 and input-/output interface 113. The output side of the power control section 116 is connected to each of the linear DC actuators. Numeral 118 denotes a robot body control unit for controlling the hand.

The linear DC actuator-type wrist mechanism of the present invention is so adapted that the attitude of the movable body is sensed by the air-core coils 86 through 90 of the above-described linear DC actuators, with all five degrees of freedom being passively controlled with the exception of rotational motion about the central axis of the movable body 100. This is accomplished through a sequence which will be described hereinbelow.

The details of the linear DC actuators (voice coil-type actuators) will be described in detail with reference to FIGS. 17 through 21.

Figure 17:
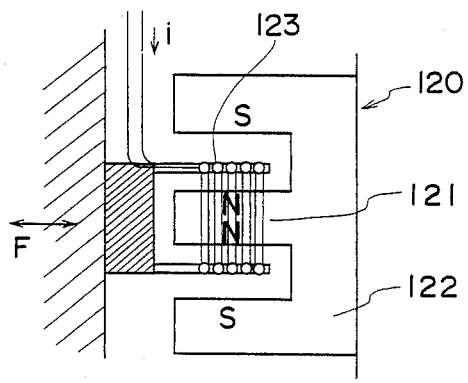
FIG. 17 is sectional view of a linear DC actuator incorporated in the assembler hand of FIG. 16.
Figure 18:
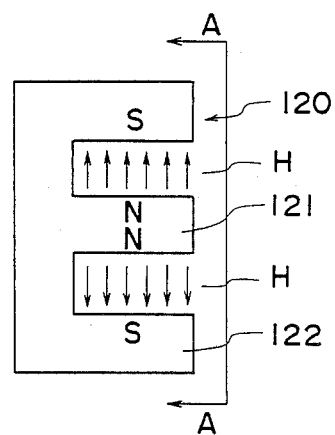
FIG. 18 is a sectional view illustrating a fixed magnetic pole in the linear DC actuator.
Figure 19:
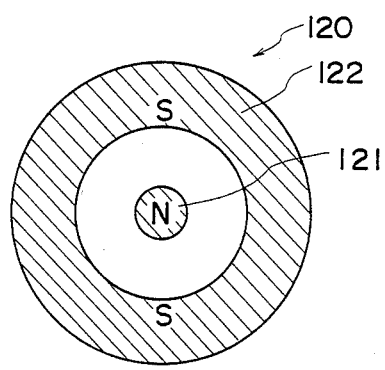
FIG. 19 is a view of the fixed magnetic pole as seen in the direction of arrows A—A of FIG. 18.
Figure 20:
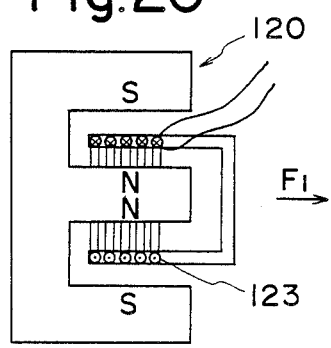
FIG. 20 is a sectional view of an air-core coil wound in a cylindrical configuration on the fixed magnetic poles.
Figure 21:
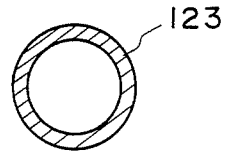
FIG. 21 is a sectional view of the air-core coil along.

As shown in FIGS. 18 and 19, there is provided a fixed magnetic pole 120 comprising a cylindrical body 122 having a circular cylinder 121 formed at its central portion. The magnetic circuit of the kind shown in these drawings produces a radiating uniform magnetic field H. When an air-core coil 123 wound into a cylindrical configuration is disposed within this magnetic field, as shown in FIG. 17, a magnetic force F can be generated which is proportional to the current i flowing through the coil 123. Let B represent the flux density of the uniform magnetic field, n the number of coil turns and i the current. The magnetic force F is expressed as follows:

$$F = k \cdot n \cdot B \cdot i$$

where k is a constant decided by the dimensions of the coil. When a direct current flows through the coil 123 in the direction shown in FIG. 20, an electromagnetic force $F_1$ in the direction of the arrow is generated in accordance with Fleming's left-hand rule. If the direction of the direct current is reversed, the electromagnetic force is also reversed.

A linear DC actuator of this type is suitable for situations where the movable body and pin are comparatively light in weight. Where control along the Z axis is concerned, therefore, if heavy movable body cannot be easily supported when depending upon the interaction of magnetic field and current, the conventional magnetic-type thrust bearing may be employed for Z-axis control. If not so much detection sensitivity is required, an arrangement can be adopted in which the movable body is supported along the Z axis in an auxiliary manner via a mechanical spring. The rotational axis $\phi$ of the movable body 100 can be held in a contactless manner using a permanent magnet or an arrangement can be adopted in which a spring is provided to prevent only the motion of the rotational axis $\phi$.

A number of advantages are gained by adopting the foregoing arrangement of the illustrated embodiment:

(1) Forces can be estimated accurately merely by measuring current values.

(2) In a region where magnetic field is constant, the above-described relationship can be obtained without relying upon the positions of the air-core coils.

(3) A bias current for linearizing the control system is unnecessary.

(4) Control of position in one degree of freedom can be carried out even by a single linear DC actuator. In other words, if the direction of current flow in this linear DC actuator changes, the direction of the force will also change, thereby enabling control to be performed by a single linear DC actuator.

(5) A travel distance of from several millimeters to several centimeters can be realized with ease. As a result, in a case where the mechanism is utilized as an assembler hand, the correctable range of position and attitude is enlarged in comparison with the ordinary magnetic bearing.

Reference will now be had to FIGS. 22 through 29 to describe modifications of the linear DC actuator of the present invention.

Figure 22:
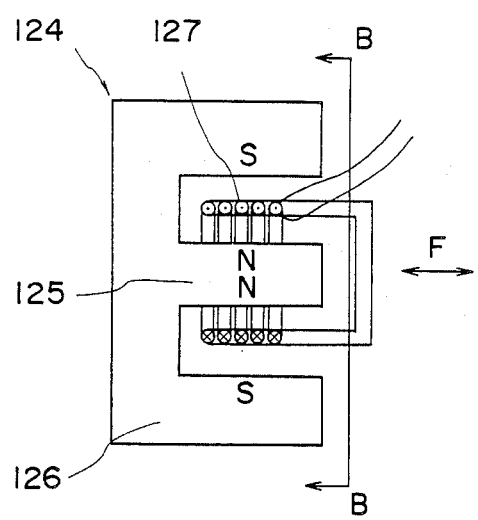
FIG. 22 is a sectional view of a linear DC actuator representing a second embodiment of the present invention.
Figure 23:
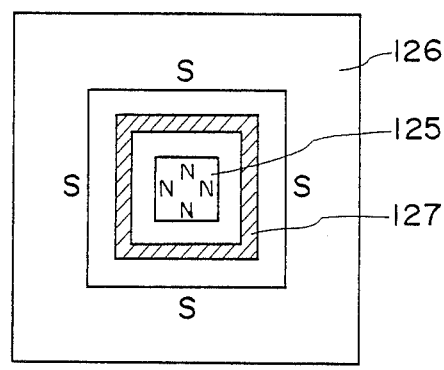
FIG. 23 is a view of the actuator as seen in the direction of arrows B—B of FIG. 22.

First, the embodiment of FIGS. 22 and 23 has a fixed magnetic pole 124 comprising a square cylindrical member 126 formed to include a prism 125 formed at its central portion, and a square air-core coil 127 instead of the aforementioned circular air-core coil.

Figure 24:
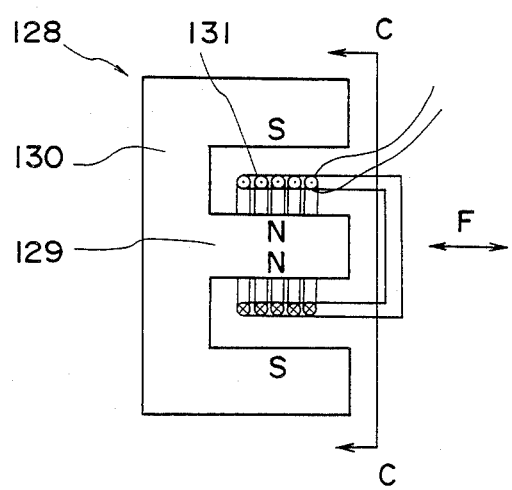
FIG. 24 is a sectional view of a linear DC actuator representing a third embodiment of the present invention.
Figure 25:
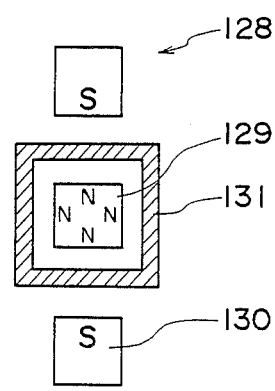
FIG. 25 is a view of the actuator as seen in the direction of arrows C—C of FIG. 24.

The embodiment of FIGS. 24 and 25 has a structure including a fixed magnetic pole 128 comprising an angle member 130 formed to include a prism 129 at its central portion, and a square air-core coil 131 wound on the prism 129.

Figure 26:
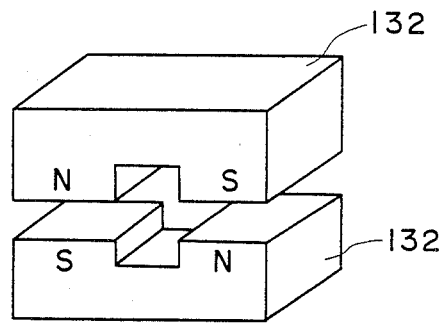
FIG. 26 is a perspective view showing the fixed magnetic poles of a linear DC actuator representing a fourth embodiment of the present invention.
Figure 27:
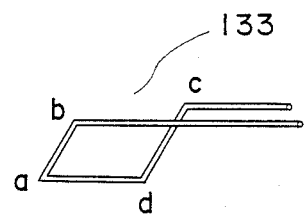
FIG. 27 is a perspective view of a coil used in the actuator of FIG. 26.
Figure 28:
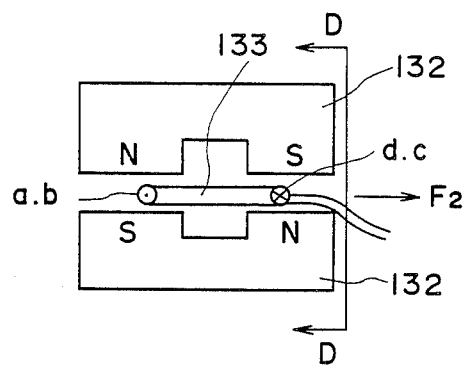
FIG. 28 is a sectional view of the actuator.
Figure 29:
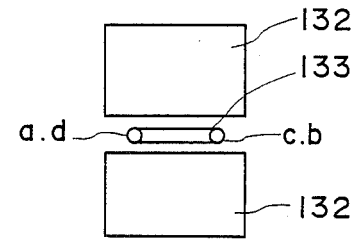
FIG. 29 is a view of the actuator as seen in the direction of arrows D—D of FIG. 28.

In the embodiment of FIGS. 26 through 29, a pair of fixed magnetic poles 132 are arranged face to face, as shown in FIG. 26, and a rectangular coil 133 of the kind shown in FIG. 27 is disposed in the uniform magnetic field. When a direct current is passed through the rectangular coil 133 as shown, for example, in FIG. 28, an electromagnetic force $F_2$ is generated in the direction of the arrow in accordance with Fleming's left-hand rule. If the direction of the direct current is reversed, the direction of the electromagnetic force $F_2$ produced will also reverse.

Figure 30:
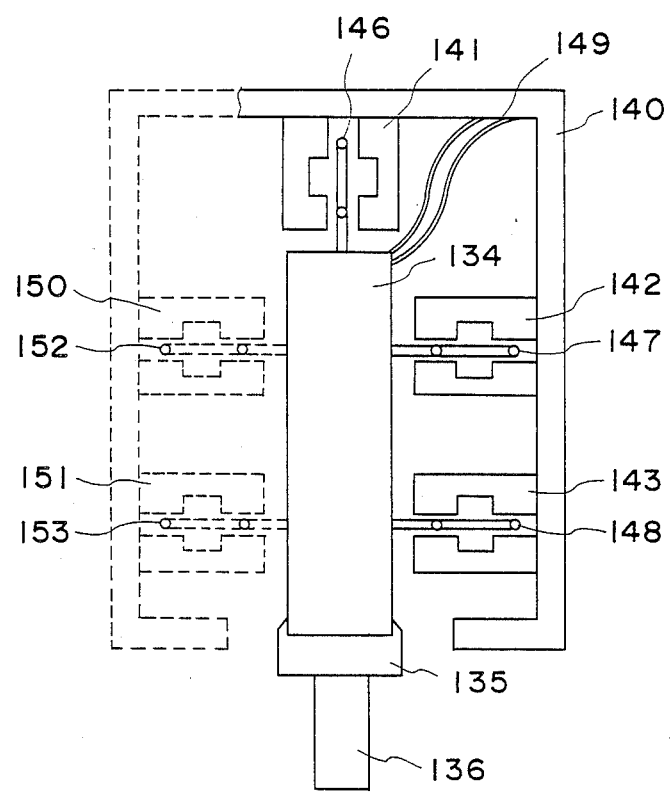
FIG. 30 is a sectional view of an assembler hand having the actuator.

An automatic assembler hand of the kind shown in FIG. 30 can be constructed by combining a plurality of these linear DC actuators. In FIG. 30, numeral 140 denotes the outer frame of the hand, and numeral 141 designates a pair of fixed magnetic poles (corresponding to the fixed magnetic poles 132 of FIG. 28) secured to the outer frame 140. The fixed magnetic poles 146 and a rectangular coil (corresponding to the rectangular coil 132 of FIG. 28) 146 construct a linear DC actuator for control along the Z axis. Similarly, a pair of fixed magnetic poles 142 and a rectangular coil 147 construct a linear DC actuator for control along the X axis at the upper part of the hand, and a pair of fixed magnetic poles 143 and a rectangular coil 148 construct a linear DC actuator for control along the X axis at the lower part of the hand. On one side of the hand, moreover, a pair of fixed magnetic poles 150 and a rectangular coil 152 construct a linear DC actuator for control along the X axis at the upper part of the hand, and a pair of fixed magnetic poles 151 and a rectangular coil 153 construct a linear DC actuator for control along the X axis at the lower part of the hand.

It should be noted that even if the linear DC actuators on the side indicated by the dashed lines are deleted, the mechanism can still perform the assembler hand function satisfactorily. Electric current is supplied to each of the coils via feeder lines 149.

With the arrangement described above, the attitude of a movable body can be controlled. For example, as shown in FIG. 15, the values of the currents supplied to the air-core coils of the linear DC actuators when the movable body 100 is at equilibrium are stored in advance as reference values in the controller 110. When the movable body 100 is displaced from the equilibrium state, the resulting change in the values of the air-core coil currents of the linear DC actuators is sensed. The distribution of current to the air-core coils of the linear DC actuators is performed on the basis of the values sensed, thereby controlling the attitude of the movable body 100. In this case, the attitude of the movable body 100 can be controlled instantaneously by preparing a table, which is stored beforehand in the memory 112, of values indicating air-core current changes and corresponding values of current distributed to the air-core coils for the purpose of controlling the attitude of the movable body 100.

Though not shown, pairs of fixed magnetic poles and their rectangular coils can be arranged at least at the front and back of the movable body at two levels to construct linear DC actuators for control along the Y axis similar to control along the X axis. In FIG. 30, numeral 134 denotes a movable body, 135 a chuck and 136 a pin to be inserted into a hole.

The present embodiment is well suited for use as a hand employed in inserting small pins and the like.

Also, the automatic assembler hand described above can be used to erect pins in a manner similar to that shown in FIGS. 5 through 8. In addition, the method of estimating the magnitude of a force acting upon a movable body to be supported and the operating point can be carried out just as described above in connection with FIGS. 9 and 10. However, the method is implemented by substituting the linear DC actuators for the electromagnets shown in FIG. 9.

Another embodiment of the invention is shown in FIGS. 31 and 32, in which 160 denotes a positioning mechanism of a robot or assembly machine, 161 the outer frame of a hand, 162 through 165 the fixed magnetic poles of linear DC actuators, 166 through 170 gap sensors, 171 a spring, 172 a movable body to be supported, 175 a part having a recess, 176 an air bearing, and 177 a base.

If a rectangular insertion member 174 is to be inserted into the recess of the part 175 placed on the base 177, as shown in FIGS. 31 and 32, control in the X-Z plane performed by the linear DC actuators is very important. As for the Y direction, it will suffice to use a support mechanism, e.g. an air bearing, which will minimize a force having components in the X-Z plane acting on the movable body 172. It is also possible to support the movable body via the balls of a ball bearing.

As for the Z direction, the movable body can be supported by a spring, in which case it is preferred that the spring force coincide with the Z direction to the greatest extent possible.

Thus, this embodiment of the present invention is suitable for assembly operations performed on a two dimensional plane. Support mechanisms relying upon springs, balls, rollers, air bearings or the like can be used for purposes other than controlling the supporting forces in the X-Z plane taking direct part in the assembly operation.

An example of an assembly method using an assembly apparatus (an electromagnetic-type RCC mechanism) of the present invention will now be described.

The RCC mechanism has a mechanical construction using springs and is designed in such a manner that when a force acts upon the tip of a pin, the center of rigidity of the pin assumes a position at the center of the pin tip in response to the force.

Figure 33:
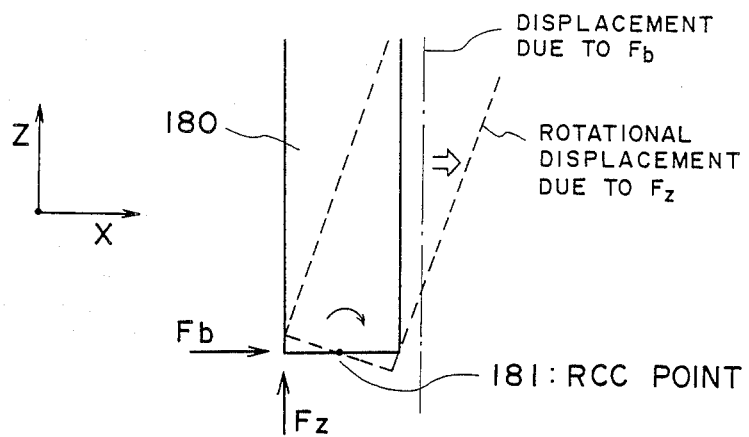
FIGS. 33 through 35 are views for describing an electromagnetic-type RCC mechanism according to the present invention.

This will now be described with regard to the X-Z plane while referring to FIG. 33.

(1) When a force $F_b$ in the X direction acts upon the tip of a pin 180, the latter is displaced so as to undergo translational motion in the X direction.

(2) In response to a force $F_z$ in the Z direction, the pin 180 undergoes rotational displacement about an RCC point 181 due to a moment produced by the application of this force.

The hand is provided with an elastic system which will satisfy the above conditions (1) and (2).

Figure 34:
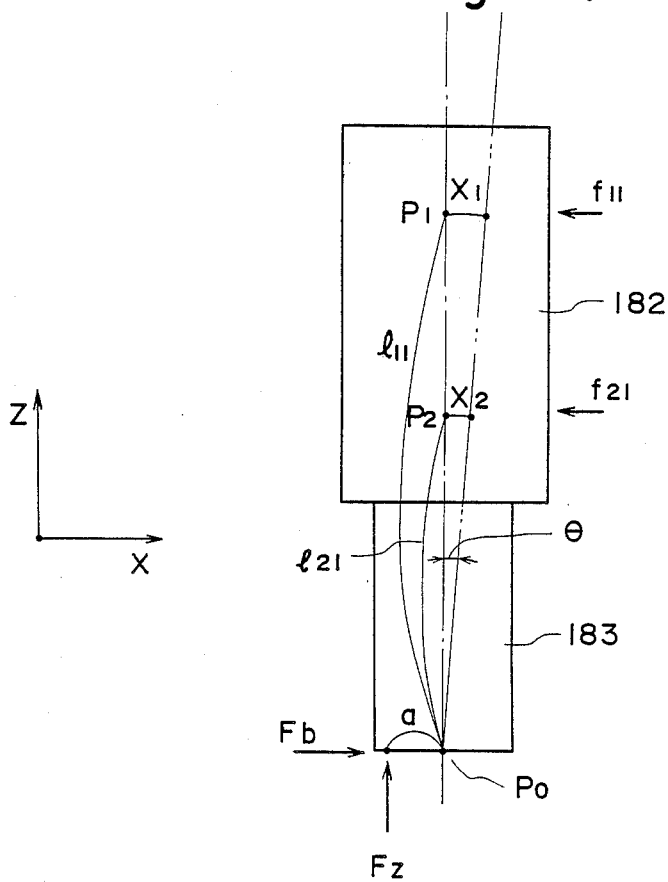

Assume that a pin 183 is attached to a movable body 182 in FIG. 34. Let $P_0$ represent the center of the tip of pin 183, $x_1$ displacement in the X direction of a point $p_1$ located at a distance $l_{11}$ from $P_0$, and $x_2$ displacement in the X direction of a point $p_2$ located at a distance $l_{21}$ from $P_0$. It can be arranged so that forces $f_{11}$, $f_{21}$ act upon the points $p_1$, $p_2$, respectively, in the abovementioned hand.

Now, assume that a point on the pin 183 at a distance a from the point $P_0$ contacts the corner of a hole in a member, so that external forces $F_b$, $F_z$ act upon the pin 183. From equilibrium of forces, it is necessary to satisfy the following conditions:

$$f_{11} + f_{21} = F_b \qquad (1)$$

$$l_{11} f_{11} + l_{21} f_{21} = a \cdot F_z \qquad (2)$$

The function of the RCC mechanism at this time is to satisfy the following equations:

$$x_1 = x_{b1} + x_{z1} \qquad (3)$$

$$x_2 = x_{b2} + x_{z2} \qquad (4)$$

$$x_{b1} = x_{b2} = k_b \cdot F_b \qquad (5)$$

$$x_{z1} = x_{z2} \cdot (l_{11}/l_{21}) = k_z \cdot a \cdot F_z \qquad (6)$$

where $x_{b1}$ represents a change in the displacement of point $p_1$ in response to $F_b$, $x_{b2}$ a change in the displacement of point $p_2$ in response to $F_b$, $x_{z1}$ represents a change in the displacement of point $p_1$ in response to $a \cdot F_z$, $x_{z2}$ a change in the displacement of rigidity with respect to $F_b$, and $k_z$ the coefficient of rigidity with respect to the moment of $a \cdot F_z$.

In the supporting mechanism of a movable body relying upon an electromagnetic device, $f_{11}$, $f_{21}$ can be obtained, with respect to $x_1$, $x_2$, from the following relations:

$$f_{11} = k_{11} x_1 + k_{12} x_2 \qquad (7)$$

$$f_{21} = k_{21} x_1 + k_{22} x_2 \qquad (8)$$

where $k_{11}$, $k_{12}$, $k_{21}$, $k_{22}$ represent feedback gains.

It is possible to determine $x_1$, $x_2$ by a linear calculation using the detection values from a minimum of two gap sensors. In other words, $x_1$, $x_2$ can be calculated by an operational amplifier or computer in the controller.

The values of $K_{11}$, $k_{12}$, $k_{21}$, $k_{22}$ can be decided so as to satisfy Eqs. (1) through (6) above. This will now be described in detail.

[1] Consider a case where $F_z=0$. In other words, assume that only the force $F_b$ is applied. From Eqs. (1) and (2) above, we have $$f_{11}+f_{21}=F_b \quad (9)$$

$$l_{11}f_{11}+l_{21}f_{21}=0 \quad (10)$$

From Eqs. (5), (6), we have:

$$x_{b1}=x_{b2}=k_b\cdot F_b \quad (11)$$

$$x_{z1}=x_{z2}(l_{11}/l_{21})=0 \quad (12)$$

From Eqs. (3), (11), we have:

$$x_1=x_{b1}=k_b\cdot F_b \quad (13)$$

From Eqs. (4), (11), we have:

$$x_2=x_{b2}=k_b\cdot F_b \quad (14)$$

Substituting Eqs. 7 and (8) into Eq. (9) gives us $$f_{11}+f_{21}=(k_{11}+k_{21})x_1+(k_{12}+k_{22})x_2 \quad (15)$$

And substituting Eqs. (13), (14) into this results in $$\therefore F_b=(k_{11}+k_{21})k_b\cdot F_b+(k_{12}+k_{22})k_b\cdot F_b \quad (16)$$

$$\therefore 1=(k_{11}+k_{21}+k_{12}+k_{22})k_b \quad \text{(i)}$$

From Eqs. (10), (7), (8) and from Eqs. (13), (14), we have $$l_{11}f_{11}+l_{21}f_{21}=(l_{11}k_{11}+l_{21}k_{21})x_1+ \quad (17)$$
$$(l_{11}k_{12}+l_{21}k_{22})x_2 =$$
$$(l_{11}k_{11}+l_{21}k_{21}+l_{11}k_{12}+l_{21}k_{22})k_b F_b$$

$$0=l_{11}k_{11}+l_{21}k_{21}+l_{11}k_{12}+l_{21}k_{22} \quad \text{(ii)}$$

[2] Next, consider a case where $F_b=0$, i.e. where only the force $F_z$ is applied.

From Eqs. (1) and (2) above, we have $$f_{11}+f_{21}=0 \quad (18)$$

$$l_{11}f_{11}+l_{21}f_{21}=a\cdot F_z \quad (19)$$

From Eqs. (3), (4), (5) and (6), we have $$x_1=0+x_{z1}=k_z\cdot a\cdot F_z \quad (20)$$

$$x_2=0+x_{z2}=(l_{21}/l_{11})\cdot k_z\cdot a\cdot F_z \quad (21)$$

From Eqs. (7) and (8), we have $$f_{11}+f_{21}=(k_{11}+k_{21})x_1+(k_{12}+k_{22})x_2 \quad (22)$$

Further, Eqs. (18), (20), (21) and 22 give us $$0=(k_{11}+k_{21})\cdot k_z\cdot a\cdot F_z+(k_{12}+k_{22})(l_{21}/l_{11})\cdot k_z\cdot a\cdot F_z \quad (23)$$

Therefore, $$l_{11}k_{11}+l_{11}k_{21}+l_{21}k_{12}+l_{21}k_{22}=0 \quad \text{(iii)}$$

From Eqs. (19), (7) and (8), we have $$l_{11}f_{11}+l_{21}f_{21}=(l_{11}k_{11}+l_{21}k_{21})x_1+(l_{11}k_{12}+l_{21}k_{22})\cdot x_2 \quad (24)$$

Further, from Eqs. (20), (21), we may write $$a\cdot F_z=(l_{11}k_{11}+l_{21}k_{21})k_z\cdot a\cdot F_z+(l_{11}k_{12}+l_{21}k_{22})(l_{21}/l_{11})\cdot k_z\cdot a\cdot F_z \quad (25)$$

$$\therefore 1=[l_{11}k_{11}+l_{21}k_{21}+l_{21}k_{12}+(l_{21}^2/l_{11})k_{22}]k_z \quad \text{(iv)}$$

If both of the forces $F_b$, $F_z$ are applied, these can be superposed. Accordingly, $k_{11}$, $k_{12}$, $k_{21}$, $k_{22}$ can be decided from (i), (ii), (iii) and (iv). Specifically, $$k_{11}+k_{21}+k_{12}+k_{22}=1/k_b \quad \text{(i)}'$$

$$l_{11}k_{11}+l_{21}k_{21}+l_{11}k_{12}+l_{21}k_{22}=0 \quad \text{(ii)}'$$

$$l_{11}k_{11}+l_{11}k_{21}+l_{21}k_{12}+l_{21}k_{22}=0p \quad \text{(iii)}'$$

$$l_{11}k_{11}+l_{21}k_{21}+l_{21}k_{12}+(l_{21}^2/l_{11})k_{22}=1/k_z \quad \text{(iv)}'$$

These simultaneous equations (i)' through (iv)' can be solved for the four unknowns $k_{11}$, $k_{21}$, $k_{12}$, $k_{22}$ owing to the existence of four independent equations. Solving these simultaneous equations, we have $$(l_{21}-l_{11})k_{21}+(l_{11}-l_{21})k_{12}=0$$

$$\therefore k_{21}-k_{12}=0$$

$$\therefore k_{21}=k_{12}$$

Accordingly, $$k_{11}+2k_{12}+k_{22}=1/k_b \quad \text{(i)}''$$

$$l_{11}k_{11}+(l_{11}+l_{21})k_{12}+l_{21}k_{22}=0 \quad \text{(ii)}''$$

$$l_{11}k_{11}+2l_{21}k_{12}+(l_{21}^2/l_{11})\cdot k_{22}=1/k_z$$

Therefore, $$l_{11}^2 k_{11}+2l_{11}\cdot l_{21}k_{12}+l_{21}^2 k_{22}=l_{11}/k_z \quad \text{(iii)}''$$

Solving this linear equation with three unknowns ultimately gives us $$k_{11}=[(l_{21}^2/k_b)+(l_{11}/k_z)]/(l_{11}-l_{21})^2$$

$$k_{12}=k_{21}$$

$$=[-(l_{11}l_{21}/k_b)-(l_{11}/k_z)]/(l_{11}-l_{21})^2$$

$$k_{22}=[(l_{11}^2/k_b)+(l_{11}/k_z)]/(l_{11}-l_{21})^2$$

It will suffice if $k_{11}$, $k_{21}$, $k_{12}$, $k_{22}$ are so decided as to satisfy these relations.

More specifically, $k_{11}$, $k_{21}$, $k_{12}$, $k_{22}$ can be decided for a case where the coefficient of rigidity $k_b$ for translational motion due to $F_b$ and the coefficient of rigidity $k_z$ for rotational motion about the RCC point due to $F_z$ are set.

Figure 35:
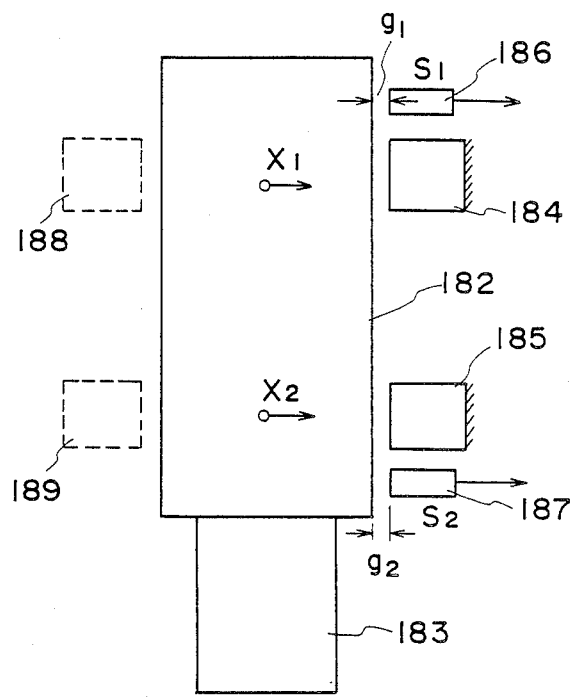

Thus, as shown in FIG. 35, electromagnetic devices 184, 185 and gap sensors 186, 187 are arranged to face a movable body 182 to which a pin 183 is attached for being inserted into a hole, and the movable body 182 is controlled by e.g. a circuit arrangement of the kind shown in FIG. 36. Gap signals $g_1$, $g_2$ are obtained from respective gap sensors 186, 187 and inputted to a linear arithmetic circuit 191, and $x_1$, $x_2$ are outputted by the linear arithmetic circuit 191. These signals are inputted to a linear arithmetic circuit 192, which uses these signals to produce command values $f_{c1}$, $f_{c2}$ of electromagnetic forces $f_{11}$, $f_{21}$, respectively. The command values $f_{c1}$, $f_{c2}$ are applied to operational amplifiers 193, 194, respectively, which compare them with presently prevailing excitation currents from respective electromagnetic devices 184, 185, the latter generating electromagnetic forces $f_{11}$, $f_{12}$. In FIG. 35, numerals 188, 189 denote electromagnetic devices. In FIG. 36, $a_{11}$, $a_{12}$, $a_{21}$, $a_{22}$ represent coefficients decided by the positions of the gap sensors.

In general, the gap sensor output signals are read in the controller and the aforementioned processing is executed within the controller to generate the electromagnetic forces $f_{11}$, $f_{21}$.

It is necessary to apply damping in order to increase stability when the pin is supported in a contactless state and when the tip of the pin contacts the member having the hole. In such case, any damping characteristic can be set by constructing a control system to generate $f_{11}$, $f_{21}$ for $x_1$, $x_2$ in such a manner that the following will hold $$\begin{pmatrix} f_{11} \\ f_{21} \end{pmatrix} = \begin{pmatrix} k_{11}, & k_{12} \\ k_{21}, & k_{22} \end{pmatrix} \begin{pmatrix} x_1 \\ x_2 \end{pmatrix} + \begin{pmatrix} D_{11}, & D_{12} \\ D_{21}, & D_{22} \end{pmatrix} \begin{pmatrix} \dot{x}_1 \\ \dot{x}_2 \end{pmatrix}$$

In the above, $\dot{x}_1$, $\dot{x}_2$ represent the time differentials of $x_1$, $x_2$ and generally may be obtained from the relation $$\begin{pmatrix} D_{11}, & D_{12} \\ D_{21}, & D_{22} \end{pmatrix} = C \begin{pmatrix} k_{11}, & k_{12} \\ k_{21}, & k_{22} \end{pmatrix}$$

In this case, contactless support is not especially required with regard to the Z axis, so that support along this axis can be realized by a spring or the like. With such an arrangement, $f_{11}$ can be decided from $x_1$, $x_2$ and not just $x_1$, and $f_{21}$ can be decided from $x_1$, $x_2$ and not just $x_2$.

Thus, a precision automatic assembly operation equivalent to that performed by an RCC hand, and provided with additional functions, can be realized.

A compliance center can be set at any position by adjusting the gain of the electromagnetic devices serving as the supporting elements.

The present invention has the following advantages:

(1) When there is a change in the length of a pin to be inserted into a hole, this can be dealt with immediately without making any mechanical modifications. The invention therefore can be used in a flexible manner.

(2) When the hand connected to a wrist mechanism moves, the rigidity of the wrist mechanism can be increased to suppress vibrations. This raises the efficiency of operation.

(3) Since the pin is supported by an electromagnetic wrist mechanism, the shock sustained when the pin strikes the surface of the member having the hole is less than that in a prior-art arrangement in which the pin is supported by a rigid body.

As many apparently widely different embodiments of the present invention can be made without departing from the spirit and scope thereof, it is to be understood that the invention is not limited to the specific embodiments thereof except as defined in the appended claims.

What we claim is:

1. A precision automatic assembly apparatus for inserting an insertable part into a hole formed in a member, comprising:
   (a) a movable hand;
   (b) a movable body incorporated in said hand;
   (c) an electromagnetic-type wrist mechanism having a plurality of electromagnetic devices for supporting said movable body and controlling said movable body along a plurality of axes, each of said electromagnetic devices comprising a linear DC actuator having an air-core coil and a magnetic pole corresponding thereto;
   (d) a position detector for detecting the position of said movable body;
   (e) said insertable part being mounted on an end portion of said movable body;
   (f) means for determining the external force which acts upon said insertable part in a position at which ssaid insertable part contacts said member based on an output signal from said position detector inputted to said determining means and current values of excitation coils of said electromagnetic devices inputted to said determining means and for determining the absence of said external force when said insertable part is aligned with and inserted into said hole; and
   (g) means for adjusting the position of said insertable part relative to said hole based on an output signal from said determining means until said insertable part and said hole are in alignment and said part is inserted in said hole.

2. The apparatus according to claim 1, wherein the end portion of said movable body is provided with a chuck in which said insertable part is mounted.

3. A precision automatic assembly apparatus for inserting an insertable part into a hole formed in a member comprising:
   (a) a movable hand;
   (b) a movable body incorporated in said hand;
   (c) a plurality of linear DC actuators each having an air-core coil and a corresponding magnetic pole for supporting said movable body and controlling said movable body along a plurality of axes;
   (d) said insertable part being mounted on an end portion of said movable body;
   (e) means for determining an external force which acts upon said insertable part in a position at which said insertable part contacts said member based on current values of the air-core coils of said linear DC actuators inputted to said determining means and for determining the absence of said external force when said insertable part is aligned with and inserted into said hole; and
   (f) means for adjusting the position of said insertable part relative to said hole based on an output signal from said determining means until said insertable part and said hole are in alignment and said part is inserted in said hole.

4. The apparatus according to claim 3 in which said air-core coil is cylindrical and said magnetic pole is a cylindrical body having a circular cylinder formed at its central portion with an air gap therearound, such cylindrical air-core coil extending into said air gap.

5. The apparatus according to claim 3, wherein said insertable part is a pin having a circular cylindrical configuration.

* * * * *